(12) United States Patent
Khaderbad et al.

(10) Patent No.: US 12,347,725 B2
(45) Date of Patent: Jul. 1, 2025

(54) SEMICONDUCTOR STRUCTURE WITH MATERIAL MODIFICATION AND LOW RESISTANCE PLUG

(71) Applicant: Taiwan Semiconductor Manufacturing Co. Ltd., Hsin-Chu (TW)

(72) Inventors: Mrunal A. Khaderbad, Hsinchu (TW); Akira Mineji, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/514,164

(22) Filed: Nov. 20, 2023

(65) Prior Publication Data
US 2024/0087952 A1    Mar. 14, 2024

Related U.S. Application Data

(60) Continuation of application No. 17/321,292, filed on May 14, 2021, now Pat. No. 11,854,871, which is a division of application No. 16/380,662, filed on Apr. 10, 2019, now Pat. No. 11,018,053.

(60) Provisional application No. 62/691,695, filed on Jun. 29, 2018.

(51) Int. Cl.
| | |
|---|---|
| H01L 21/768 | (2006.01) |
| H01L 21/3115 | (2006.01) |
| H01L 23/522 | (2006.01) |
| H01L 23/532 | (2006.01) |
| H10D 30/62 | (2025.01) |
| H10D 64/01 | (2025.01) |

(52) U.S. Cl.
CPC .. *H01L 21/76831* (2013.01); *H01L 21/76825* (2013.01); *H01L 21/7684* (2013.01); *H01L 21/76879* (2013.01); *H01L 23/522* (2013.01); *H01L 23/53266* (2013.01); *H10D 64/01* (2025.01); *H01L 21/31155* (2013.01); *H10D 30/6219* (2025.01)

(58) Field of Classification Search
None
See application file for complete search history.

(56) References Cited

U.S. PATENT DOCUMENTS

| | | |
|---|---|---|
| 5,899,740 A | 5/1999 | Kwon |
| 6,225,204 B1 * | 5/2001 | Wu ............... H01L 21/76814 438/743 |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Khaja Ahmad
(74) *Attorney, Agent, or Firm* — HAYNES AND BOONE, LLP

(57) ABSTRACT

A semiconductor device that includes a semiconductor substrate, a dielectric layer over the semiconductor substrate, a conductive feature over the semiconductor substrate and buried in the dielectric layer, and a metal plug over the conductive feature and buried in the dielectric layer, where the dielectric layer has a hydrophobic sidewall facing the metal plug.

20 Claims, 22 Drawing Sheets

(56) References Cited

U.S. PATENT DOCUMENTS

| | | | |
|---|---|---|---|
| 9,520,482 B1 | 12/2016 | Chang et al. | |
| 9,576,814 B2 | 2/2017 | Wu et al. | |
| 2010/0184288 A1* | 7/2010 | Park | H01L 21/3212 |
| | | | 257/E21.295 |
| 2012/0009719 A1* | 1/2012 | Ahn | H0F 39/028 |
| | | | 257/E31.127 |
| 2012/0302047 A1* | 11/2012 | Lee | H10D 30/025 |
| | | | 438/482 |
| 2013/0049219 A1* | 2/2013 | Tsai | H01L 21/02063 |
| | | | 257/774 |
| 2014/0027822 A1 | 1/2014 | Su et al. | |
| 2015/0311114 A1* | 10/2015 | Huang | H01L 23/528 |
| | | | 257/773 |
| 2015/0340315 A1* | 11/2015 | Suzuki | H10D 64/514 |
| | | | 257/338 |
| 2016/0365274 A1* | 12/2016 | Choi | H01L 21/76897 |
| 2017/0288036 A1 | 10/2017 | Chen et al. | |
| 2018/0033728 A1* | 2/2018 | Zhang | H01L 23/53209 |
| 2018/0083002 A1 | 3/2018 | Kim et al. | |
| 2018/0219010 A1* | 8/2018 | Kim | H01L 21/02362 |

* cited by examiner

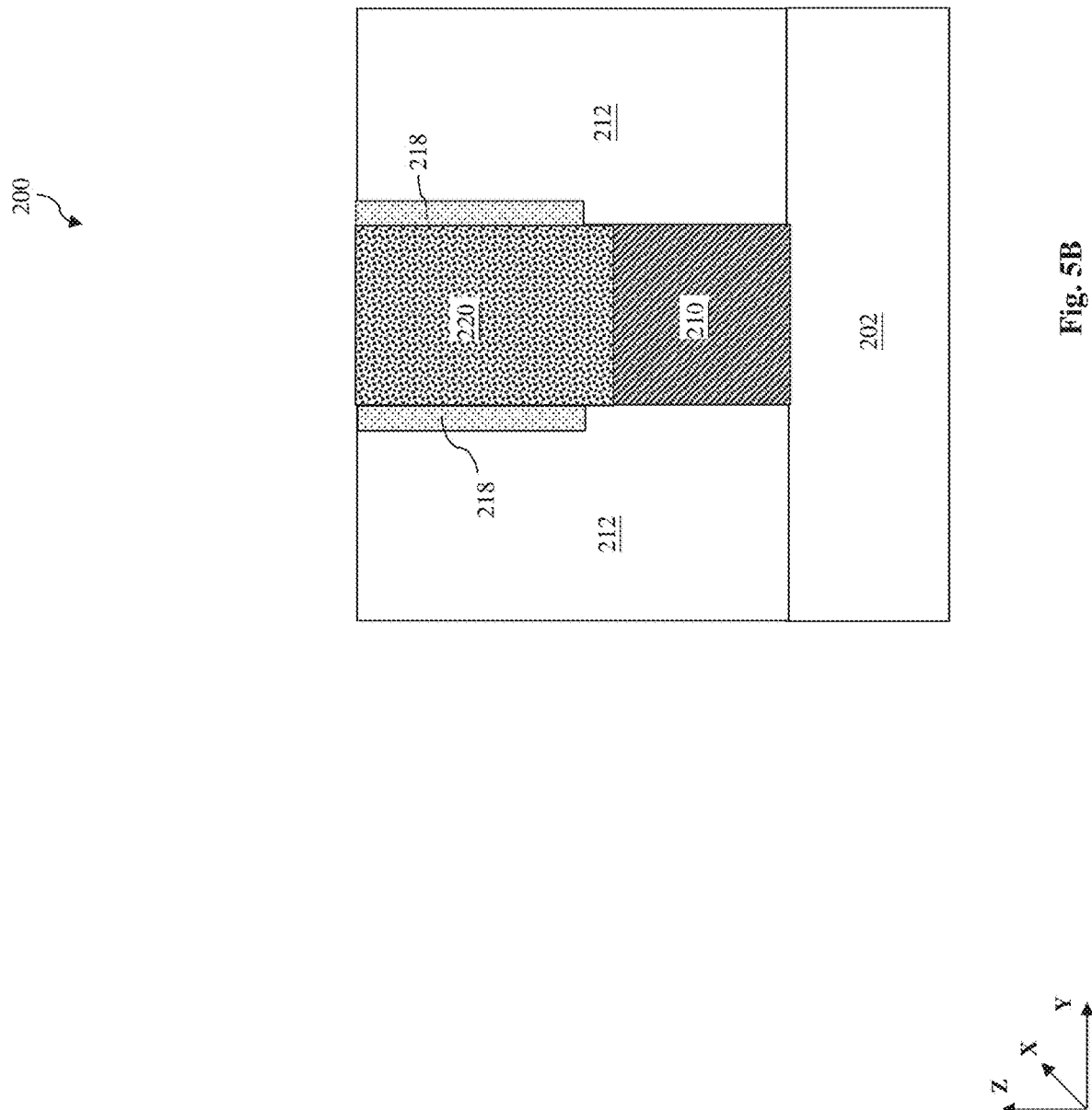

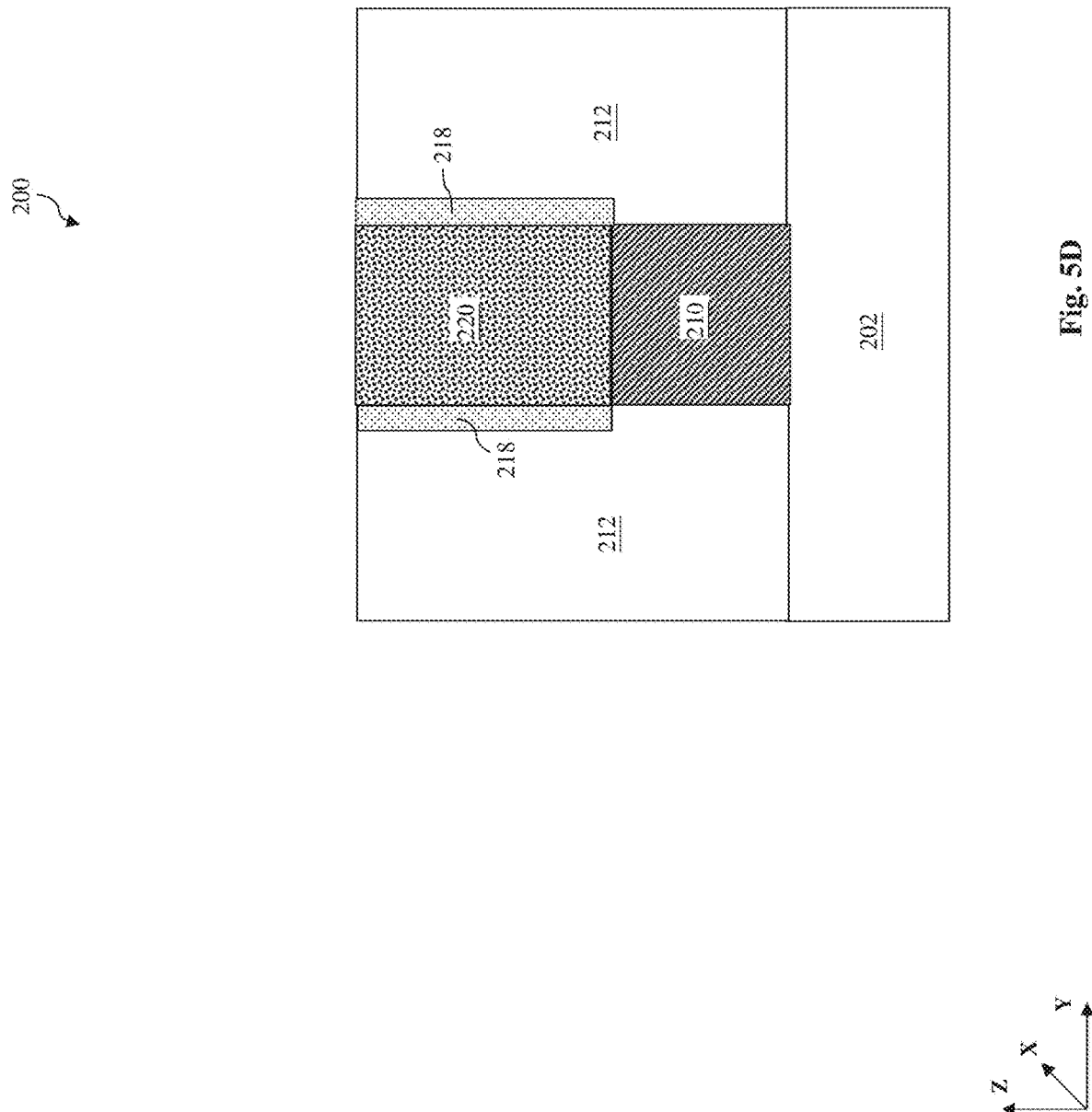

SEMICONDUCTOR STRUCTURE WITH MATERIAL MODIFICATION AND LOW RESISTANCE PLUG

CROSS-REFERENCE TO RELATED APPLICATIONS

This is a continuation application of U.S. patent application Ser. No. 17/321,292, filed May 14, 2021, which is a divisional application of U.S. patent application Ser. No. 16/380,662, filed Apr. 10, 2019, which claims the benefits of and priority to U.S. Provisional Application No. 62/691,695, filed Jun. 29, 2018, each of which is herein incorporated by reference in its entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET device structure may still have certain drawbacks. For example, contacts of FinFET devices have smaller dimensions, causing high contact resistance. Conventional contacts of the FinFET devices also include a barrier layer, which further reduces the dimensions of the contacts holes. Furthermore, metal filling to a contact hole is another challenge on concerns, such as voids or other defects.

Therefore, although existing FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 2, 2A, 3A, 3B, 4, 5A, 5B, 5C, 5D and 5E illustrate fragmentary cross-sectional side views of a portion of an IC structure at various stages of fabrication according to different embodiments of the present disclosure.

DETAILED DESCRIPTION

Figure 1:
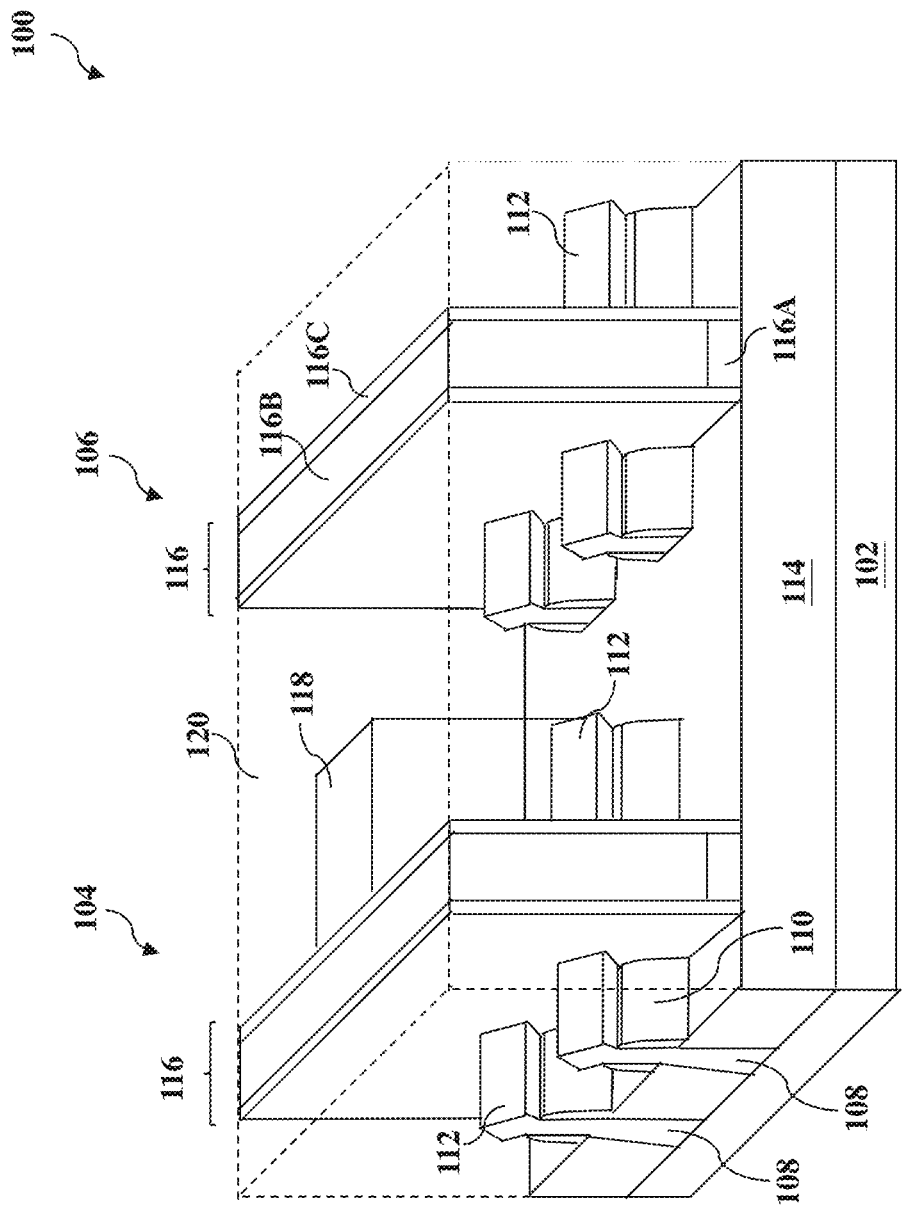
FIG. 1 is a perspective view of an example integrated circuit (IC) structure according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method to form a metal plug, such as a contact or a via using material modification. One type of semiconductor device in which the processes of the present disclosure may be implemented may include FinFET devices. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) Fin-FET device and an N-type metal-oxide-semiconductor (NMOS) FinFET device. The following disclosure may use one or more FinFET examples to illustrate various embodiments of the present disclosure, but it is understood that the application is not limited to the FinFET device, except as specifically claimed.

Referring to FIG. 1, a perspective view of an example FinFET device structure 100 is illustrated. The FinFET device structure 100 includes a semiconductor substrate 102. The semiconductor substrate 102 may be made of silicon or other semiconductor materials. Alternatively, or additionally, the semiconductor substrate 102 may include other elementary semiconductor materials such as germanium. In some embodiments, the semiconductor substrate 102 is made of a compound semiconductor such as silicon carbide, gallium arsenic, indium arsenide, or indium phosphide. In some embodiments, the semiconductor substrate 102 is made of an alloy semiconductor such as silicon germanium, silicon germanium carbide, gallium arsenic phosphide, or gallium indium phosphide. In some embodiments, the semiconductor substrate 102 includes an epitaxial layer. For example, the semiconductor substrate 102 may include an epitaxial layer overlying a bulk semiconductor. The FinFET device structure 100 includes an N-type FinFET device structure (nFinFET) 104 and a P-type FinFET device structure (pFinFET) 106.

The FinFET device structure 100 also includes one or more fin structures 108 (e.g., Si fins) that extend from the semiconductor substrate 102 in the Z-direction and surrounded by fin spacer 110 in the Y-direction. The fin structures 108 are elongated in the X-direction and may optionally include germanium (Ge). The fin structure 108 may be formed by using suitable processes such as photolithography and etching processes. In some embodiments, the fin structure 108 is etched from the semiconductor substrate 102 using dry etch or plasma processes. In some other embodiments, the fin structure 108 can be formed by a double-patterning process, a multiple-patterning process or a spacer patterning process. For example, the double-patterning process is a method of constructing a pattern on a substrate by dividing the pattern into two interleaved patterns. Double-patterning process allows enhanced feature (e.g., fin) density. The fin structure 108 also includes an epi-grown material, which may (along with portions of the fin structure 108) serve as a source/drain (S/D) feature 112 of the FinFET device structure 100. In some embodiments, the S/D feature 112 for the nFinFET 104 includes a semiconductor material doped with an n-type dopant, such as SiP, SiPC, or a III-V group semiconductor material (InP, GaAs, AlAs, InAs, InAlAs, or InGaAs); and the S/D feature 112 for the pFinFET 106 includes a semiconductor material doped with a p-type dopant, such as SiB, SiGeB, GeB, or a III-V group semiconductor material (Si, SiGe, SiGeB, Ge or III-V (InSb, GaSb, or InGaSb).

An isolation structure 114, such as a shallow trench isolation (STI) structure, is formed to surround the fin structure 108. In some embodiments, a lower portion of the fin structure 108 is surrounded by the isolation structure 114, and an upper portion of the fin structure 108 protrudes from the isolation structure 114, as shown in FIG. 1. In other words, a portion of the fin structure 108 is embedded in the isolation structure 114. The isolation structure 114 prevents electrical interference or crosstalk.

The FinFET device structure 100 further includes a gate stack structure 116 including a gate dielectric layer 116A; a gate electrode 116B on the gate dielectric layer 116A; and a gate spacer 116C on sidewalls of the gate electrode 116B. The gate dielectric layer 116A may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 116B may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 116B may be formed in a gate last process (or gate replacement process).

The gate spacer 116C may include any suitable dielectric material, such as a semiconductor oxide, a semiconductor nitride, a semiconductor carbide, a semiconductor oxynitride, other suitable dielectric materials, and/or combinations thereof. The gate spacers 116C may have multiple films, such as two films (a silicon oxide film and a silicon nitride film) or three films ((a silicon oxide film; a silicon nitride film; and a silicon oxide film). The gate spacer 116C and the fin spacer 110 may be formed in a same procedure including deposition and anisotropic etch.

In some embodiments, the gate stack structure 116 includes additional layers, such as interfacial layers, capping layers, diffusion/barrier layers, or other applicable layers. In some embodiments, the gate stack structure 116 is formed over a central portion of the fin structure 108. In some other embodiments, multiple gate stack structures 116 are formed over the fin structure 108. In some other embodiments, the gate stack structure 116 includes a dummy gate stack and is replaced later by a metal gate (MG) after high thermal budget processes are performed.

The gate stack structure 116 is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

One or more contact 118 is formed on the S/D feature 112 and is further coupled to an interconnection structure. The contact 118 includes metal and is landing on the S/D feature 112. The FinFET device structure 100 also includes an interlevel dielectric (ILD) layer 120 formed on the semiconductor substrate 102 to provide isolation functions among various conductive features, such as the gate electrode 116B and the S/D feature 112. The ILD layer 120 includes one or more dielectric material and may be formed by deposition and chemical mechanical polishing (CMP). The ILD layer 120 is drawn in FIG. 1 by dashed lines as transparent so that various components (e.g., the gate stack structure 116, the S/D feature 112 and the contact 118) are visible.

FinFET devices offer several advantages over traditional Field-Effect Transistor devices (also referred to as planar transistor devices). These advantages may include better chip area efficiency, improved carrier mobility, and fabrication processing that is compatible with the fabrication processing of planar devices. Thus, it may be desirable to design an IC chip using FinFET devices for a portion of, or the entire IC chip.

However, conventional FinFET fabrication may still have shortcomings. For example, Contacts to the gate stack, source and drain of the FinFET have various concerns due to the scaled-down critical dimensions, circuit pattern density, and 3D profiles of the fin structure 108. The metal plug resistance is desired to be as low as possible to reduce parasitic resistance and interconnect resistance, to achieve high drive currents in advanced transistors. Due to aggressive scaling of critical dimensions, use of existing barrier layer, resistivity performance and gap-fill capabilities of metal plug become more difficult in advanced nodes. Usually the barrier layer is deposited by ALD, which conformally deposits in the contact hole and reduces the size of the contact hole. A CVD is followed to fill metal in the shrunk contact hole. Consequently, the metal plug has high resistance and is costly to fabricate, which is also undesirable.

To overcome the problems discussed above, the present disclosure utilizes a novel fabrication process flow to provide material modification, especially forming a barrier layer by applying an ion implantation process to sidewalls of a contact hole, thereby providing a modified sidewall surface with intensified structure to prevent inter-diffusion and with changed surface characteristic to boost a bottom-up deposition for metal fill. Advantageously, the fabrication processes of the present disclosure can achieve metal plug with reduced resistance and enhanced metal filling capability.

Figure 6C:
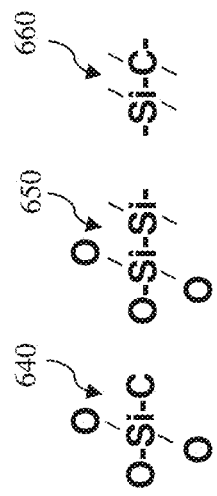
FIGS. 6A, 6B and 6C illustrate schematic views of chemical structure of a modified sidewall surface according to different embodiments of the present disclosure.
Figure 6B:
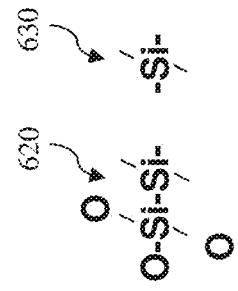
Figure 6A:
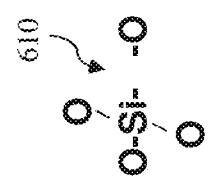
Figure 7:
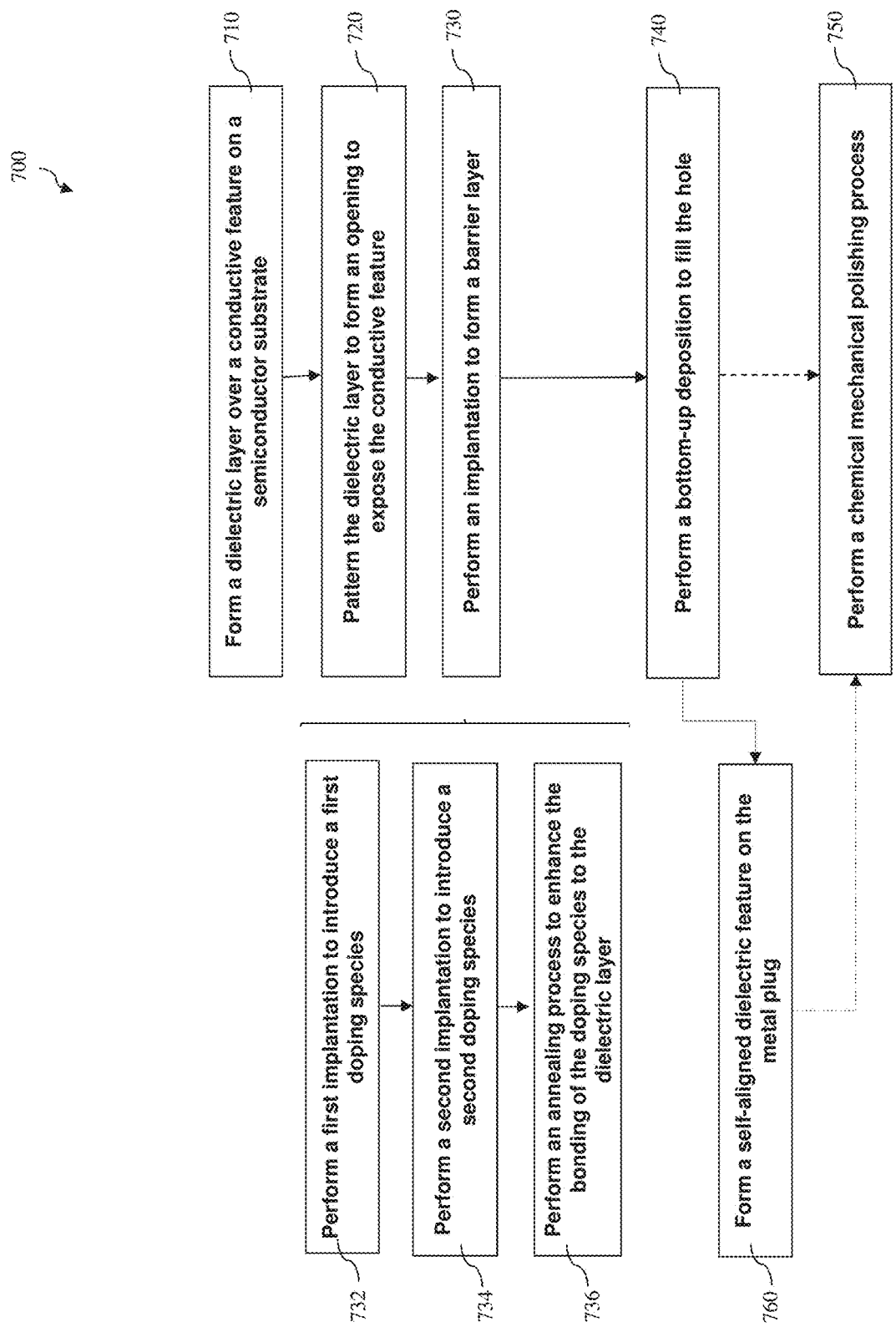
FIG. 7 is a flowchart illustrating a method of fabricating the IC structure according to embodiments of the present disclosure.

The various aspects of the present disclosure are discussed below in more detail with reference to FIGS. 2, 2A, 3A, 3B, 4, 5A-5D, 6A-6C and 7. In that regard, FIGS. A, 2A, 3A, 3B, 4, 5A-5D illustrate fragmentary cross-sectional side views of an integrated circuit (IC) structure 200 at various stages of fabrication, FIGS. 6A-6C illustrate schematic views of chemical structure of a modified sidewall surface, and FIG. 7 is a flowchart illustrating a method 700 of fabricating the IC structure according to embodiments of the present disclosure.

Figure 2:
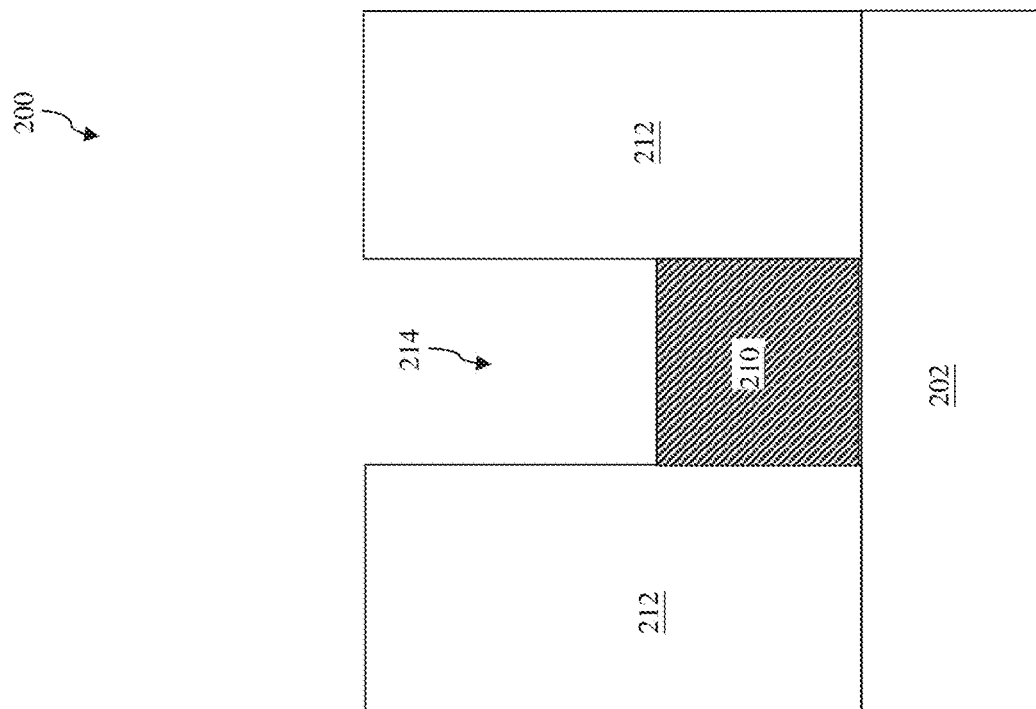
Figure 2:
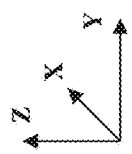
Figure 2A:
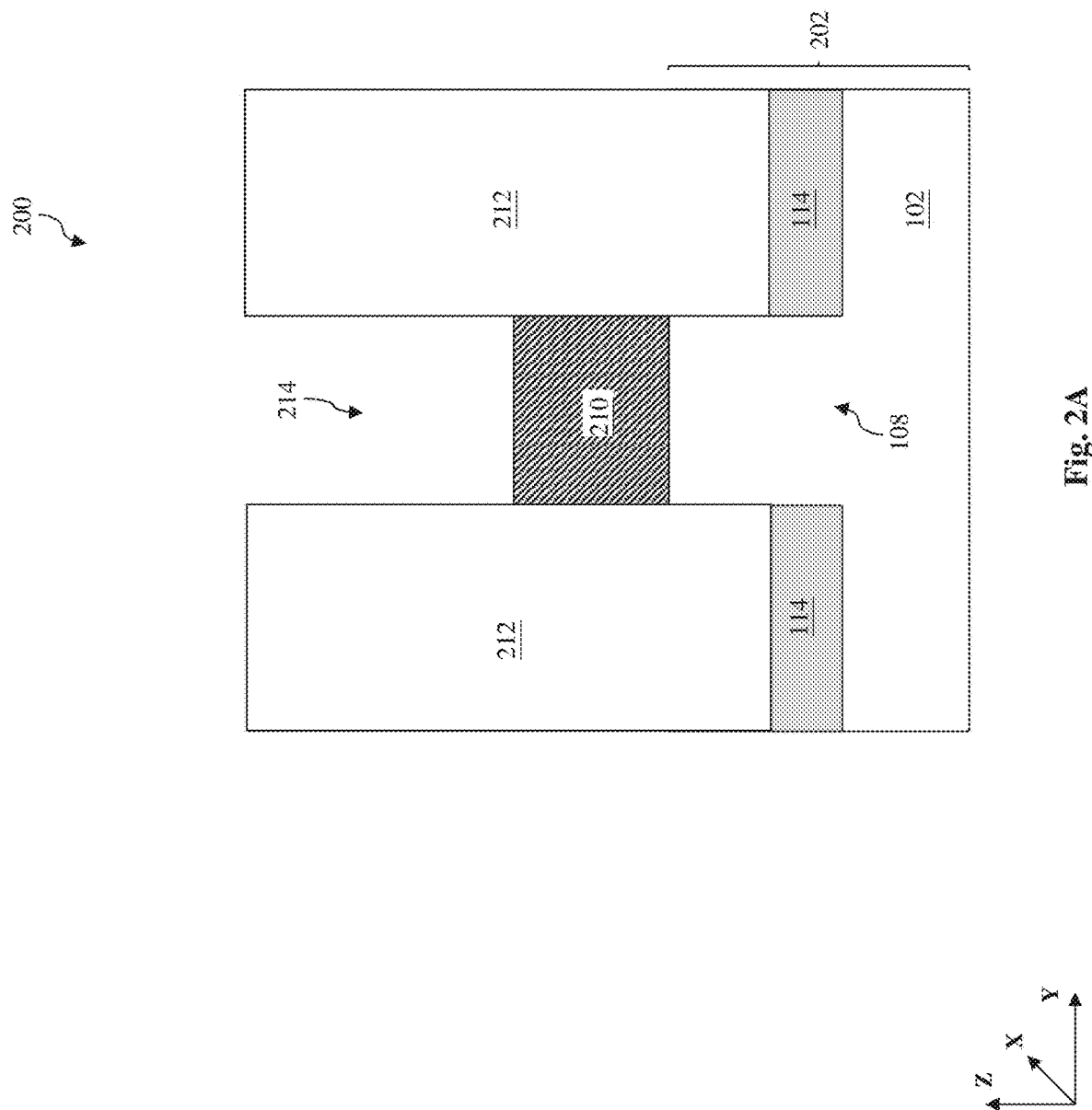

Referring now to FIG. 2, a cross-sectional side view of the IC structure 200 is illustrated. The cross-sectional side view of FIG. 2 is taken at a plane defined by the Y-direction (horizontal direction) and the Z-direction (vertical direction) of FIG. 1. Thus, the cross-sectional side views may also be referred as Y-cut views. The cross-sectional views may be taken along one of the fin structures 108 in the Y-direction, for example.

The IC structure 200 includes a substrate 202. The substrate 202 may be implemented as an embodiment of the semiconductor substrate 102 discussed above with reference to FIG. 1. In some embodiments, the substrate 202 may include a portion of the fin structure 108 and the isolation structure 114 of FIG. 1, such as one illustrated in FIG. 2A.

The IC structure 200 includes a conductive feature 210 formed on the substrate 202. In the present embodiment, the conductive feature 210 is a S/D feature epitaxially grown on the fin structure 108 and may be partially embedded in the fin structure 108.

A dielectric layer 212 is formed on the substrate 202. In the present embodiment, the dielectric layer 212 is an ILD layer. The dielectric layer 212 includes one or more dielectric material, such as silicon oxide, low-k dielectric material or other suitable dielectric material formed by deposition and CMP. In various embodiments, the dielectric layer 212 is deposited by CVD, HDPCVD, sub-atmospheric CVD (SACVD), a high-aspect ratio process (HARP), a flowable CVD (FCVD), and/or a spin-on process. In some embodiments, an etch stop layer is deposited between the ILD layer and the substrate 202 with a different composition, such as silicon nitride, to achieve etch selectivity.

A patterning process is applied to pattern the dielectric layer 212 to form an opening (or trench) 214 of the dielectric layer 212 such that the conductive feature 210 is exposed within the opening 214. A patterning process includes a lithography process and etching. A lithography process forms a patterned photoresist layer that defines a region for the opening 214. An etching process is applied to the dielectric layer 212 using the patterned photoresist layer as an etching mask. The etching process may include wet etch, dry etch, other suitable etch or a combination thereof.

A lithography process may include photoresist coating, soft baking, mask aligning, exposure, post-exposure baking, developing photoresist, and hard baking. A photoresist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. The lithography process may also be implemented or replaced by other proper methods such as mask-less photolithography, electron-beam writing, ion-beam writing, and molecular imprint.

In some embodiments, a hard mask may also be used as an etch mask. In this procedure, a hard mask is deposited; a photoresist layer is formed by a lithography process; an etching process is applied to the hard mask to transfer the opening from the photoresist layer to the hard mask; the photoresist layer may be removed by wet stripping or plasma ashing; and then another etching process is applied to the dielectric layer 212 using the hard mask as an etch mask.

Figures 3A, 3B:
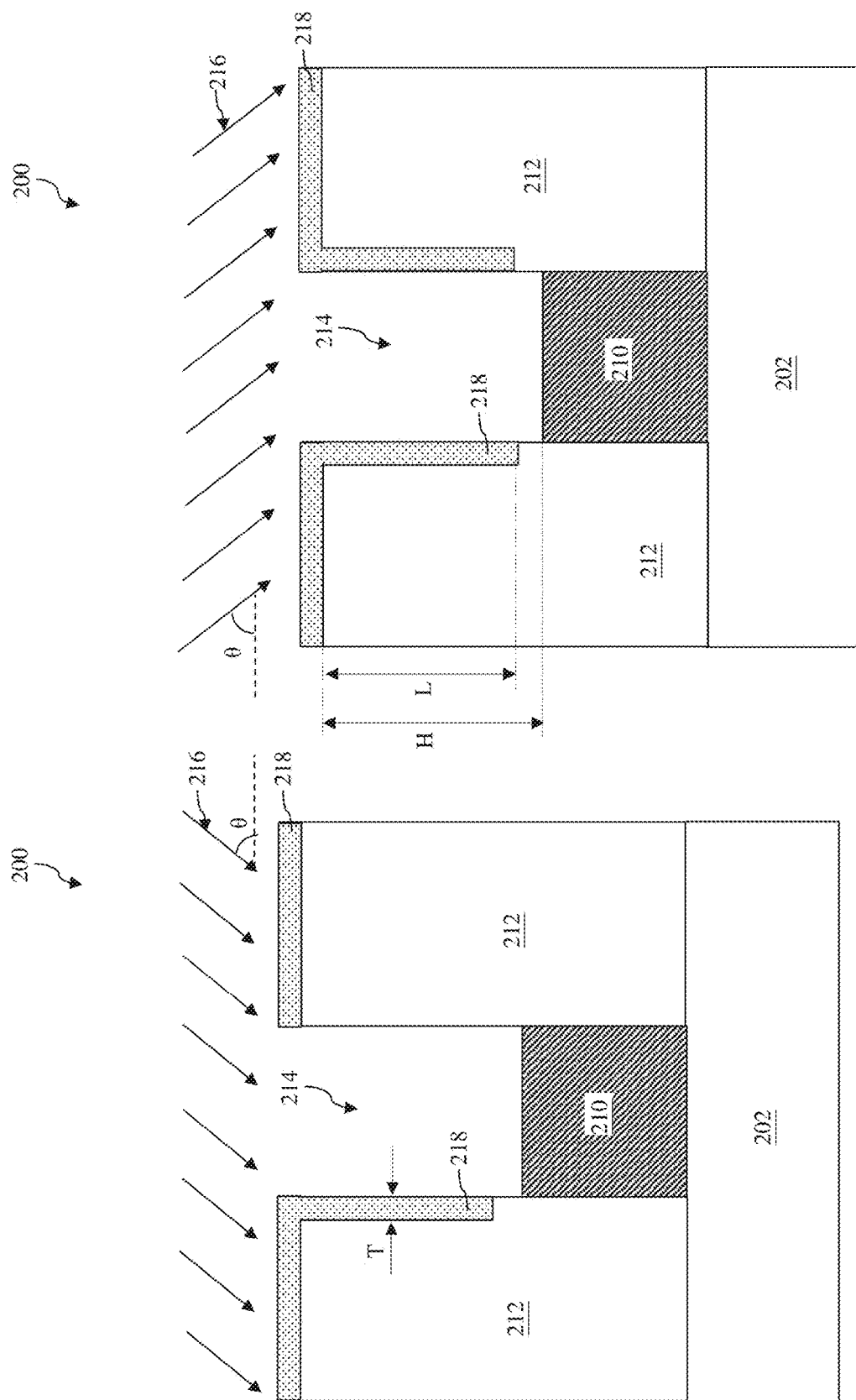

Referring now to FIGS. 3A and 3B. an ion implantation process 216 is performed to implant one or more doping species into the sidewalls of the dielectric layer 212 within the opening 214, thereby forming a barrier layer 218 with intensified structure to prevent the inter-diffusion and a modified surface characteristic to boost bottom-up deposition. However, the barrier layer 218 is different from the existing barrier layer in terms of composition and formation. The barrier layer 218 is formed by ion implantation instead of deposition, and it is formed on the sidewalls of the opening 214 but not on the bottom surface of the opening 214, where the bottom surface of the opening 214 is the top surface of the conductive feature 210. Furthermore, the barrier layer 218 and the dielectric layer 212 are similar but different in composition. The dielectric layer 212 includes a dielectric material (such as silicon oxide) and the barrier layer 218 includes the dielectric material doped with one or more doping species. The barrier layer 218 is designed with a thickness (T) and a doping concentration (C) to effectively prevent the inter-diffusion and boost bottom-up deposition. This is further described in detail below.

The ion implantation process introduces the doping species into sidewall surface of the dielectric layer 212 with a depth (that is the thickness T of the barrier layer 218) and a doping concentration C greater enough to form the barrier layer 218 effectively preventing the inter-diffusion and boosting the bottom-up deposition, and less enough without impacting the adjacent device features. In some embodiments according to experiments and analysis, the barrier layer 218 thus formed has a thickness T greater than 2 nm; and a doping concentration C greater than 10% (atomic percentage). In some embodiments according to experiments and analysis, the barrier layer 218 thus formed has a thickness T ranging between 2 nm and 10 nm; and a doping concentration C ranging between 10% and 50% (atomic percentage). In some embodiments, the barrier layer 218 has a thickness T ranging between 5 nm and 8 nm; and a doping concentration C ranging between 20% and 40% (atomic percentage). The thickness may be controlled by plasma energy, bias power, tilt angle, and/or other parameters of the ion implantation process.

The ion implantation process is a tilted ion implantation process with a tilt angle θ such that the doping species is introduced to the sidewalls of the opening 214 but not on the bottom surface (that is the top surface of the conductive feature 210) of the opening 214. The tilt angle θ is designed such that the whole sidewall surface of the opening 214 is implanted down to the level at the top surface of the conductive feature 210 or alternatively only to an upper portion of the sidewall of the opening 214 as illustrated in FIGS. 3A and 3B. It is found, through various experiments and analysis, that the length L of the barrier layer 218 relative to the height H with a ratio L/H in a certain range, such as being greater than or equal to about 0.7 and less than 0.9, is effective for bottom-up deposition. In other words, the length of the barrier layer 218 ranges between 0.7H and 0.9H. In other words, the ratio L/H ranges between 0.7 and 0.9. The tilt angle θ is determined by the targeted length L (such as between 0.7H and 0.9H) of the barrier layer 218 and the aspect ratio of the opening 214. Accordingly, the tilt angle θ is designed in a range between 30 degrees and 60 degrees, or between 40 degrees and 50 degrees, in some examples. During the ion implantation process, the IC structure 200 rotates along an axis in the Z direction so various sidewalls of the opening 214 receive the doping species uniformly. While the IC structure 200 rotates during the ion implantation process, the left sidewall of the opening 214 is implanted as illustrated in FIG. 3A; and the right sidewall of the opening 214 is also implanted as illustrated in FIG. 3B. The barrier layer 218 is also formed on the top surface of the dielectric layer 212, which remains in the final structure or is alternatively removed.

The doping species may include silicon, carbon, or both silicon and carbon to create a hydrophobic surface to boost the bottom-up deposition. In some embodiments, the dielectric layer 212 includes silicon oxide while the barrier layer 218 includes silicon oxide doped with silicon to create a silicon-rich silicon oxide layer. In some embodiments, the dielectric layer 212 includes silicon oxide while the barrier layer 218 includes silicon oxide doped with carbon to create a silicon carbide oxide layer. In some embodiments, the dielectric layer 212 includes silicon oxide while the barrier layer 218 includes silicon oxide doped with silicon and carbon to create a silicon-rich silicon carbide oxide layer. As an example, illustrated in FIG. 6A, the dielectric layer 212 includes silicon oxide, the ion implantation breaks a silicon-oxide bond 610 and generate a bonding between silicon and the doping species. When silicon is implanted into silicon oxide, a silicon-silicon bonding 620, a dangling silicon 630, or both may be generated with respective chemical structures illustrated in FIG. 6B. When carbon is additionally implanted into silicon oxide, a silicon-carbon bonding 640, a silicon-silicon bonding 650, a silicon-carbon bonding 660 or all of those may be generated with respective chemical structures illustrated in FIG. 6C. Such formed barrier layer 218 not only prevents the inter-diffusion but also have the surface characteristic changed, such as from hydrophilic to hydrophobic, to boost the bottom-up deposition. For example, it is observed that ruthenium deposition on the silicon-rich surface has increased deposition selectivity due to the hydrophobic surface.

In various embodiments regarding to the doping species silicon and carbon, the ion implantation process implants silicon to the dielectric layer 212 with an implantation energy ranging between 1 keV and 3 keV and a doping dosage ranging between 0.5E16/cm2 and 1.5E16/cm2; and alternatively or additionally implants silicon to the dielectric layer 212 with an implantation energy ranging between 0.5 keV and 2 keV and a doping dosage ranging between 0.5×1016/cm2 and 1.5×1016/cm2.

In some embodiments, the ion implantation process includes a first implantation to introduce silicon and a second implantation to introduce carbon. In furtherance of the embodiments, an annealing process is further applied thereafter to enhance the bonding of silicon and carbon to the dielectric layer 212. In various embodiment, the annealing process includes an annealing temperature ranging between 200° C. and 600° C.

For the similar effects (densified structure and modified surface characteristic), other species may be used, such as germanium and boron to replace silicon and carbon, respectively. In various embodiments, the ion implantation process includes a pair of elements, such as germanium and carbon, silicon and boron, or germanium and boron, to achieve the same effect of silicon and carbon. In other embodiments, the doping species may include nitrogen, B18Hx, B22Hx, C7Hx, C16Hx, COx, or a combination thereof. In the above chemical formula, the subscript "x" represents an integer, such as 1, 2, 3, 4, etc.

Figure 4:
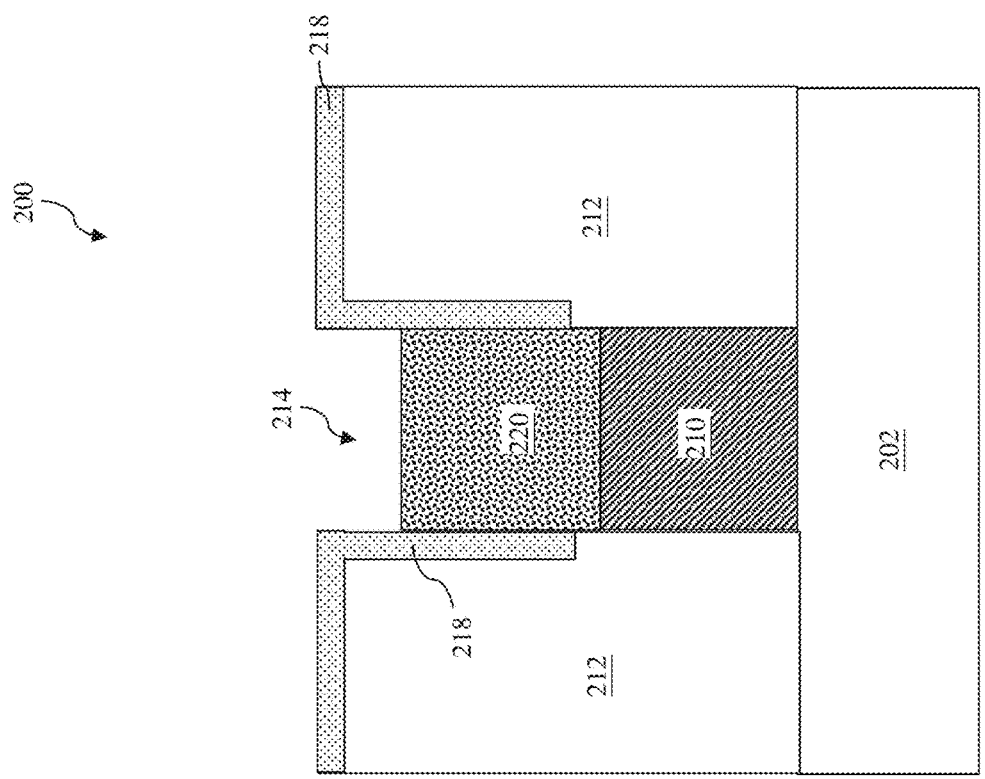

Referring to FIG. 4, a bottom-up deposition is performed to fill the opening 214 with a metal material, such as a metal or a metal alloy, thereby forming a metal plug 220 in the opening 214. In the bottom-up deposition, the metal is selectively deposited on the conductive feature 210 due to the modified sidewall surface characteristic. Specifically, the barrier layer 218 inhibits the metal material from depositing on the modified surface, such as the sidewall and the top surface of the dielectric layer 212. In the present embodiment, no additional barrier is needed since the barrier layer 218 formed by the ion implantation process functions as barrier to prevent the inter-diffusion. With additional barrier, the width of the opening 214 will be further reduced, rendering metal filling more challenge. Furthermore, the modified sidewall surface characteristic makes the metal deposition selective to achieve the bottom-up deposition, which is advantageous in the gap filling.

The metal plug 220 includes ruthenium (Ru), cobalt (Co), nickel (Ni), tungsten (W), molybdenum (Mo), iridium (Jr), osmium (Os), platinum (Pt), or a combination thereof. In some embodiments, the metal plug 220 may include copper or aluminum, depending on the size and location (such as contact, via-to-gate or via-to-contact) of the metal plug 220. The bottom-up deposition may include CVD, ALD, PVD, electrochemical Plating (ECP) or electroless deposition (ELD). In various embodiments, the bottom-up deposition includes reactant gas, such as metal-containing precursors (such as metal organic or inorganic chemical), H2, O2, NH3, and a combination thereof, with pressure ranging between 0.0001 Torr and 10 Torr. The carrier gas includes argon or N2 with a gas flow rate ranging between 10 standard cubic centimeters per minute (sccm) and 500 sccm. The bottom-up deposition further includes deposition temperature ranging between 50° C. and 500° C.

Figure 5A:
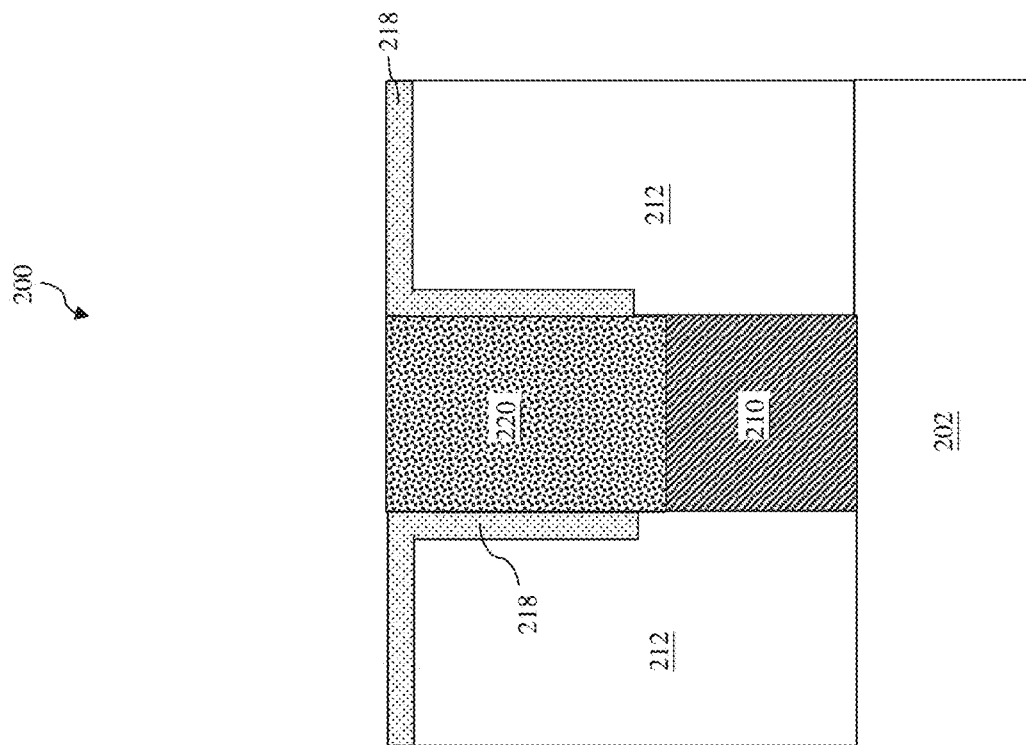
Figure 5A:

Referring to FIG. 5A, a bottom-up deposition is controlled with a deposition duration such that the metal plug 220 reaches up to the top surface of the dielectric layer 212 and has a top surface being substantially coplanar with that of the dielectric layer 212. In this case, the CMP process is skipped to achieve the fabrication efficiency. Alternatively, the bottom-up deposition is controlled with a deposition duration such that the top surface of the metal plug 220 reaches above the top surface of the dielectric layer 212. Thereafter, a CMP process is applied to planarize the top surface. In some embodiments, a precleaning process is applied to remove metal oxide prior to the bottom-up deposition, using a suitable chemical, such as hydrochloric acid-hydrogen peroxide-water mixture (HPM) or sulfuric peroxide mixture (SPM).

Figure 5C:
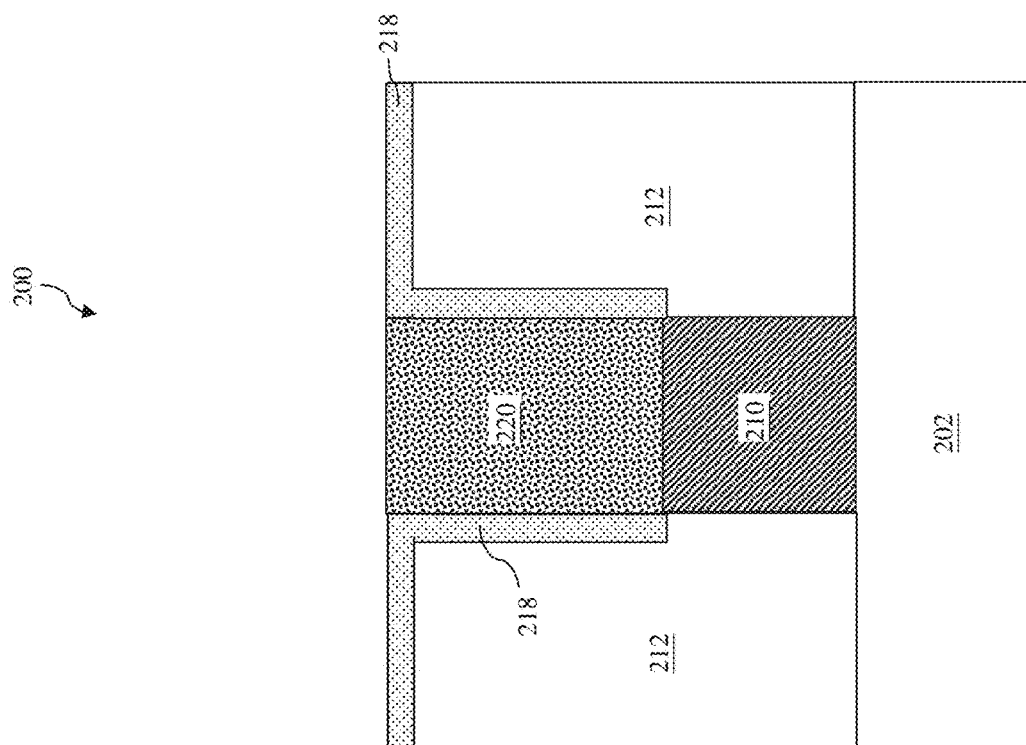
Figure 5C:

In some embodiments, the CMP process may additionally remove the barrier layer 218 formed on the top surface of the dielectric layer 212, as illustrated in FIG. 5B. In some other embodiments, the ion implantation is designed with a tilt angle such that the barrier layer 218 reaches to the top surface of the conductive feature 210 such as illustrated in FIGS. 5C and 5D.

Figure 5E:
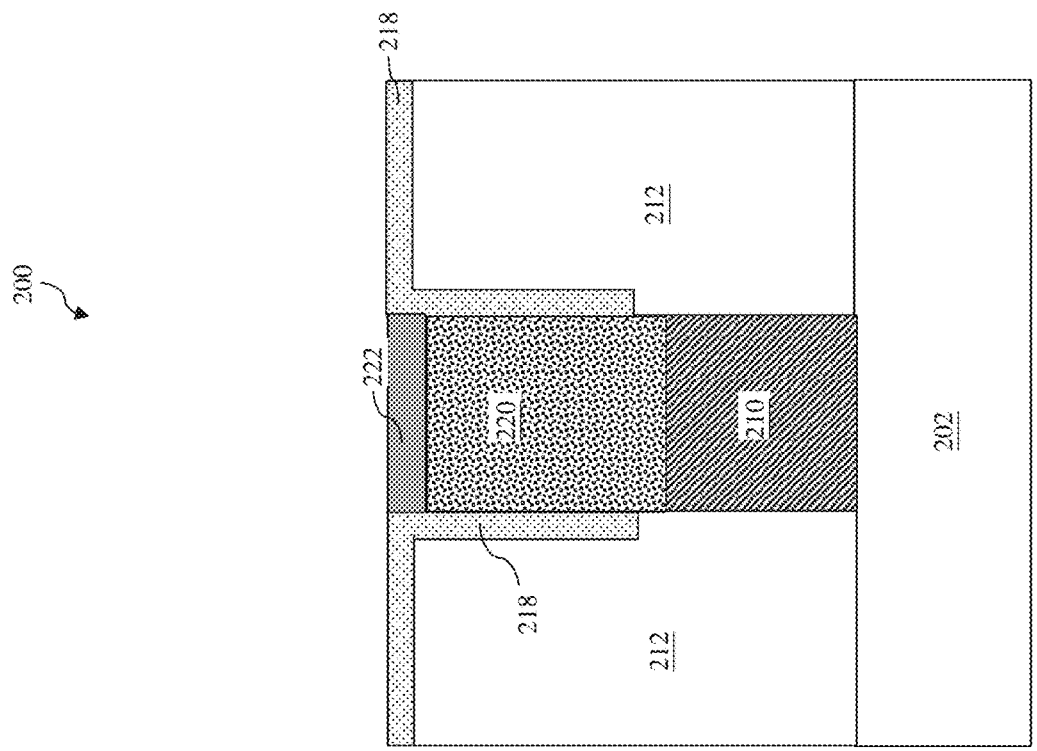

In some embodiments, a self-aligned dielectric feature 222 is formed on the top of the metal plug 220 to cap the metal plug 220, as illustrated in FIG. 5E. In furtherance of the embodiments, the bottom-up deposition is controlled with a deposition duration such that the top surface of the metal plug 220 is below the top surface of the dielectric layer 212, with a recess on the metal plug 220. Then a dielectric material, such as metal oxide or other suitable dielectric material different from that of the dielectric layer 212, is deposited on the metal plug 220 in the recess, and a CMP process is further applied to remove the excessive dielectric material and planarize the top surface. Alternatively, utilizing the modified surface characteristic of the barrier layer 218, the dielectric material is selectively deposited on the metal plug 220 to fill the recess, thereby forming the self-aligned dielectric feature 222. The self-aligned dielectric feature 222 serves to form an overlying conductive feature self-aligned to the metal plug 220 due to the etching selectivity. Similarly, the self-aligned dielectric feature 222 may be formed on the metal plug 220 with the barrier layer 218 having different schemes, such as those illustrated in FIG. 5B, 5C or 5D.

Referring to FIG. 7, the method 700 includes an operation 710 to form a dielectric layer 212 on a substrate 202; an operation 720 to pattern the dielectric layer 212 to form an opening 214 such that a conductive feature 210 is exposed within the opening 214; and an operation 730 to perform an ion implantation process to the sidewall surface of the dielectric layer 213 within the opening 214, thereby forming a barrier layer 218 in the opening 214. In some embodiments, the operation 730 further includes a first step 732 to perform a first implantation to introduce a first doping species (such as silicon) to the sidewall surface of the dielectric layer 212; a second step 734 to perform a second implantation to introduce a second doping species (such as carbon) to the sidewall surface of the dielectric layer 212 to form the barrier layer 218; and a third step 736 to perform an annealing process to the barrier layer 218 to enhance the bonding of the doping species to the dielectric layer 212. The method 700 further proceeds to an operation 740 to perform a bottom-up deposition to fill the opening 214 with a metal, thereby forming the metal plug 220. The operation 740 may further include a precleaning process to remove metal oxide or other undesired residuals. The method 700 may include an operation 750 to perform a CMP process to remove the excessive metal and planarize the top surface, or alternatively the CMP process is skipped if the bottom-up deposition is controlled to fill the metal up to the to surface of the opening 214.

In some embodiments, the method 700 includes an operation 750 to a self-aligned dielectric feature 222 to cap the metal plug 220. Specifically, the bottom-up deposition at the operation 740 is controlled with a deposition duration such that the top surface of the metal plug 220 is below the top surface of the dielectric layer 212, with a recess on the metal plug 220. Then a dielectric material, such as metal oxide or other suitable dielectric material different from that of the dielectric layer 212, is deposited on the metal plug 220 in the recess, and a CMP process is further applied to remove the excessive dielectric material and planarize the top surface. Alternatively, utilizing the modified surface characteristic of the barrier layer 218, the dielectric material is selectively deposited on the metal plug 220 to fill the recess, thereby forming the self-aligned dielectric feature 222. One advantage of the operation 750 in combination with the operation 740 is that the recess on the metal plug 220 is formed by controlling the deposition duration without utilizing an additional etching process to recess the metal plug 220, reducing the fabrication cost.

In various example, the conductive features 210 is a doped semiconductor feature, such as a S/D feature, a channel, a gate electrode, or a contact, the metal plug 220 is a contact landing on the S/D feature, a metal electrode landing on the channel, a via landing on the gate electrode, or a via landing on the contact, respectively. In some embodiment, the method 700 may be employed to form both contact and via. The method 700 may include other operations before, during or after the above operations. For example, the method 700 may include an operation to form a conventional barrier layer on the barrier layer 218 to further enhance the barrier function to prevent the interdiffusion. The conventional barrier layer may include titanium (Ti), titanium nitride (TiN), tantalum (Ta) and tantalum nitride (TaN), W, Mo, Jr, Os, Pt, or other metal with metal barrier property. However, this conventional barrier layer can be thinner to achieve the same or more high effectiveness, considering the collective effect with the barrier layer 218. In some embodiment, the dielectric layer 212 includes an etch stop layer (such as silicon nitride) and an ILD layer (such as silicon oxide) over the etch stop layer.

In some embodiments, the method 700 is used to form a contact landing on the S/D feature, a via landing on the gate electrode, and a via landing on the contact. The various aspects of the present disclosure are discussed below in more detail with reference to FIGS. 8, 9, 10, 11, 12 and 13. In that regard, FIGS. 8-12 illustrate fragmentary cross-sectional side views of an IC structure 800 at various stages of fabrication, and FIG. 13 is a flowchart illustrating a method 1300 of fabricating the IC structure according to embodiments of the present disclosure.

Figure 8:
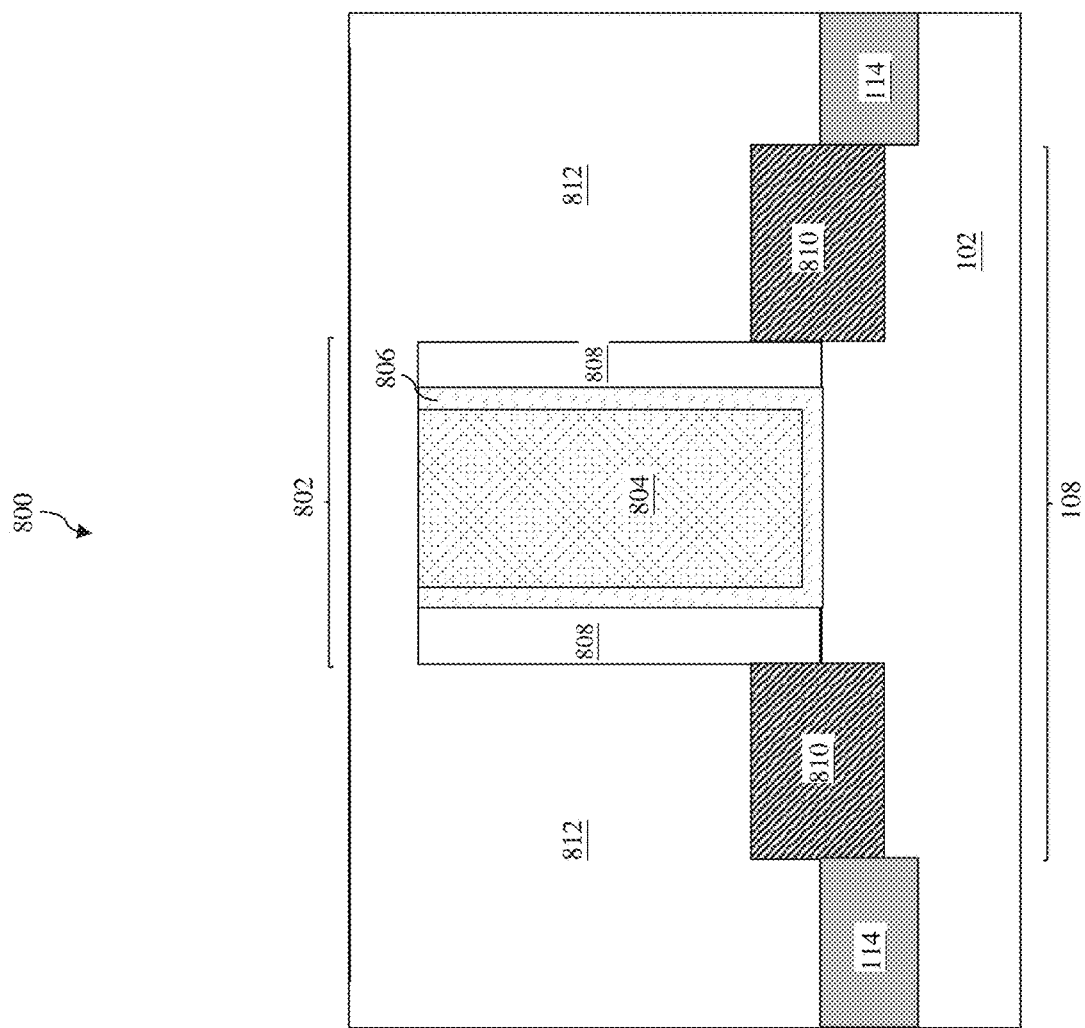
FIGS. 8, 9, 10, 11 and 12 illustrate fragmentary cross-sectional side views of a portion of an IC structure at various stages of fabrication according to embodiments of the present disclosure

Referring now to FIG. 8, a cross-sectional side view of the IC structure 800 is illustrated. The cross-sectional side view of FIG. 8 is taken at a plane defined by the X-direction (horizontal direction) and the Z-direction (vertical direction) of FIG. 1. Thus, the cross-sectional side views may also be referred as X-cut views. The cross-sectional views may be taken along one of the fin structures 108 in the X-direction, for example.

The IC structure 800 includes a gate stack structure 802 formed on a semiconductor substrate 102, especially at least partially on the fin structure 108. The gate stack structure 802 further includes a gate electrode 804, a gate dielectric layer 806 inserted between the gate electrode 804 and the semiconductor substrate 102; and a gate spacer 808 disposed on the sidewalls of the gate electrode 804. In some embodiments, the gate stack structure 802 deposition and patterning or may be formed by gate replacement. In this case, the gate dielectric layer 806 is U-shaped and surrounding the gate electrode 804.

The IC structure 800 includes S/D features 810 formed on the fin structure 108 and disposed on both side of the gate stack structure 802. The S/D features 810 may be formed by a process that includes etching to recess the fin structure in the S/D regions and epitaxially grow with one or more semiconductor material, such as silicon, germanium, silicon germanium, or silicon carbide doped with n-type dopant (such as phosphorous) or p-type dopant (such as boron).

A first dielectric layer 812 is formed on the semiconductor substrate 102 by deposition and may further be followed by CMP to planarize the top surface. In some embodiments, the first dielectric layer 812 includes an ILD layer and may further include an etch stop layer underlying the ILD layer. In some embodiments, the ILD layer silicon oxide, silicon oxycarbide, low-k dielectric material, extreme low-k dielectric material, hafnium oxide, zirconium oxide, other suitable dielectric material or a combination thereof. The etch stop layer includes SiN, SiCN, SiOC, SiON, SiCN, SiOCN, or a combination thereof.

Figure 9:
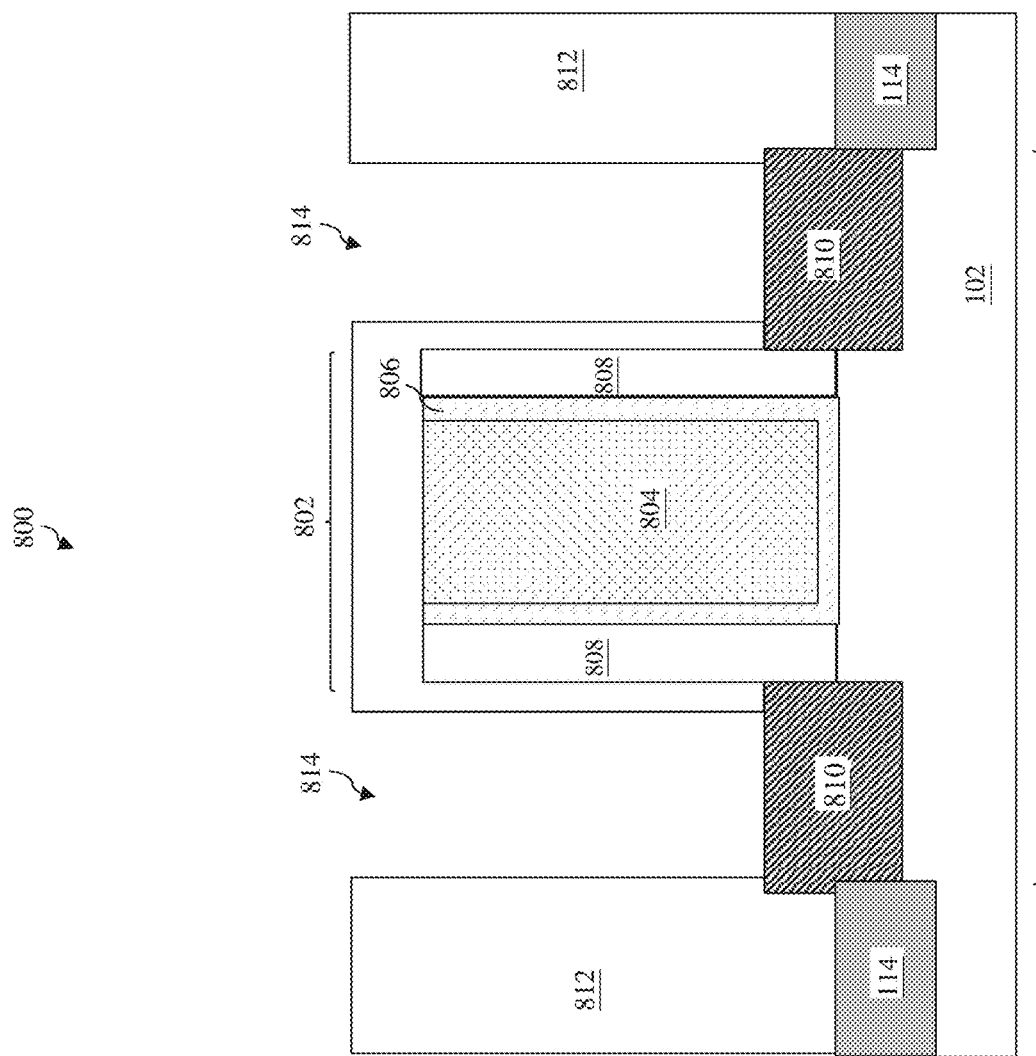

Referring now to FIG. 9, a patterning process is applied to the first dielectric layer 812 to form one or more contact hole 814 to expose the corresponding S/D feature 810 in the contact hole 814. The patterning process includes lithography process and etching and may further use a hard mask. A silicide layer may be formed on the S/D feature 810 to reduce the contact resistance by a suitable procedure, such as depositing a metal (such as nickel or cobalt), annealing to react the metal with silicon, and etching to remove the unreacted metal. Alternative, the silicide may be formed by directly depositing a silicide material on the S/D feature 810.

Figure 10:
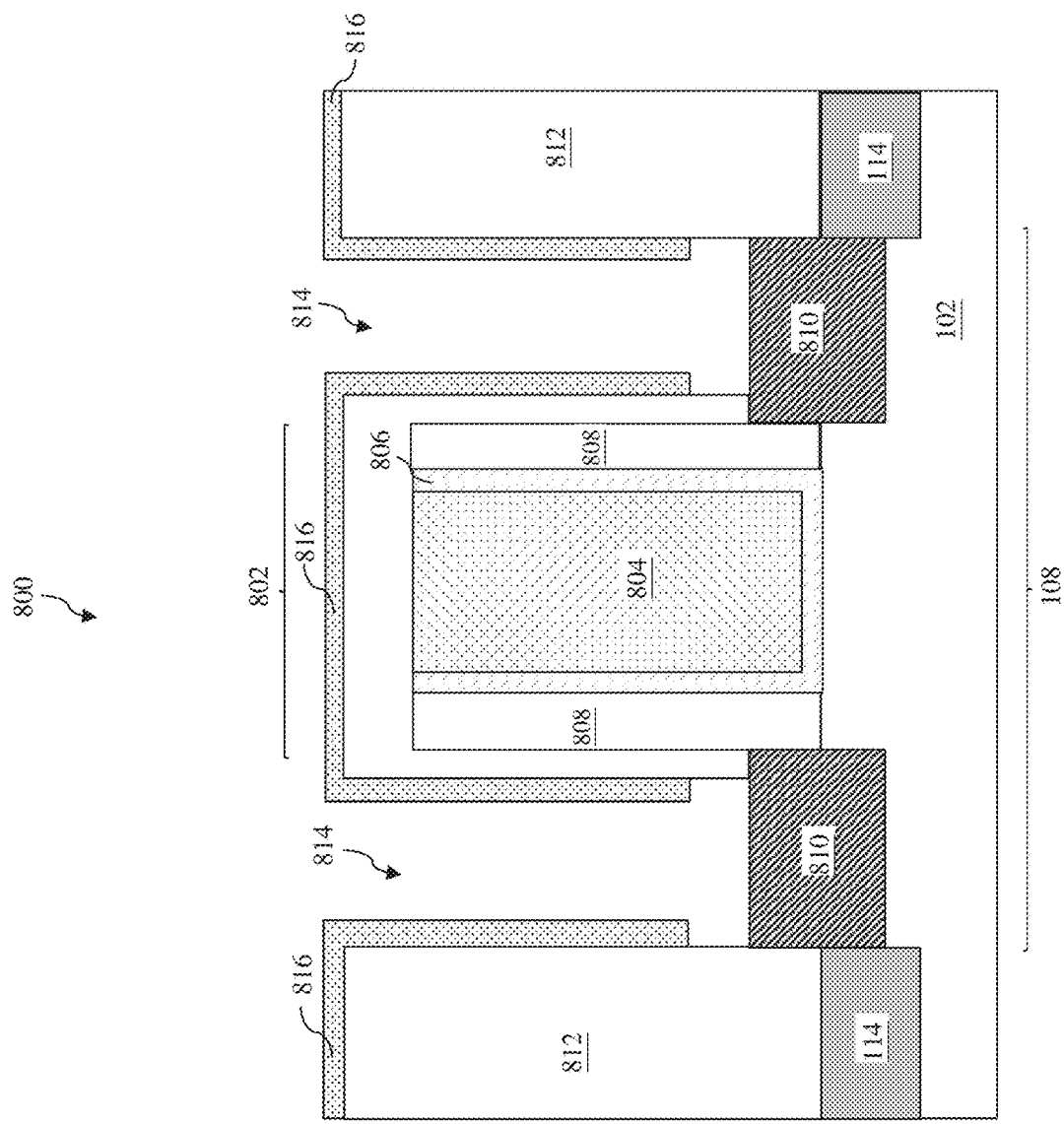

Referring now to FIG. 10, an ion implantation process is applied to the sidewalls of the contact hole 814, thereby forming a barrier layer 816. In various embodiments, the ion implantation process is a tilted ion implantation with a tilt angle such that upper portions are implanted or alternatively the sidewalls are implanted all way down to the S/D feature 810. In some embodiments, a second barrier layer is further formed on the barrier layer 816. The second barrier layer may include titanium, titanium nitride, tantalum, tantalum nitride, W, Mo, Jr, Pt, Os or a combination thereof. The second barrier layer may have a reduced thickness ranging from 0.5 nm to 5 nm.

Figure 11:
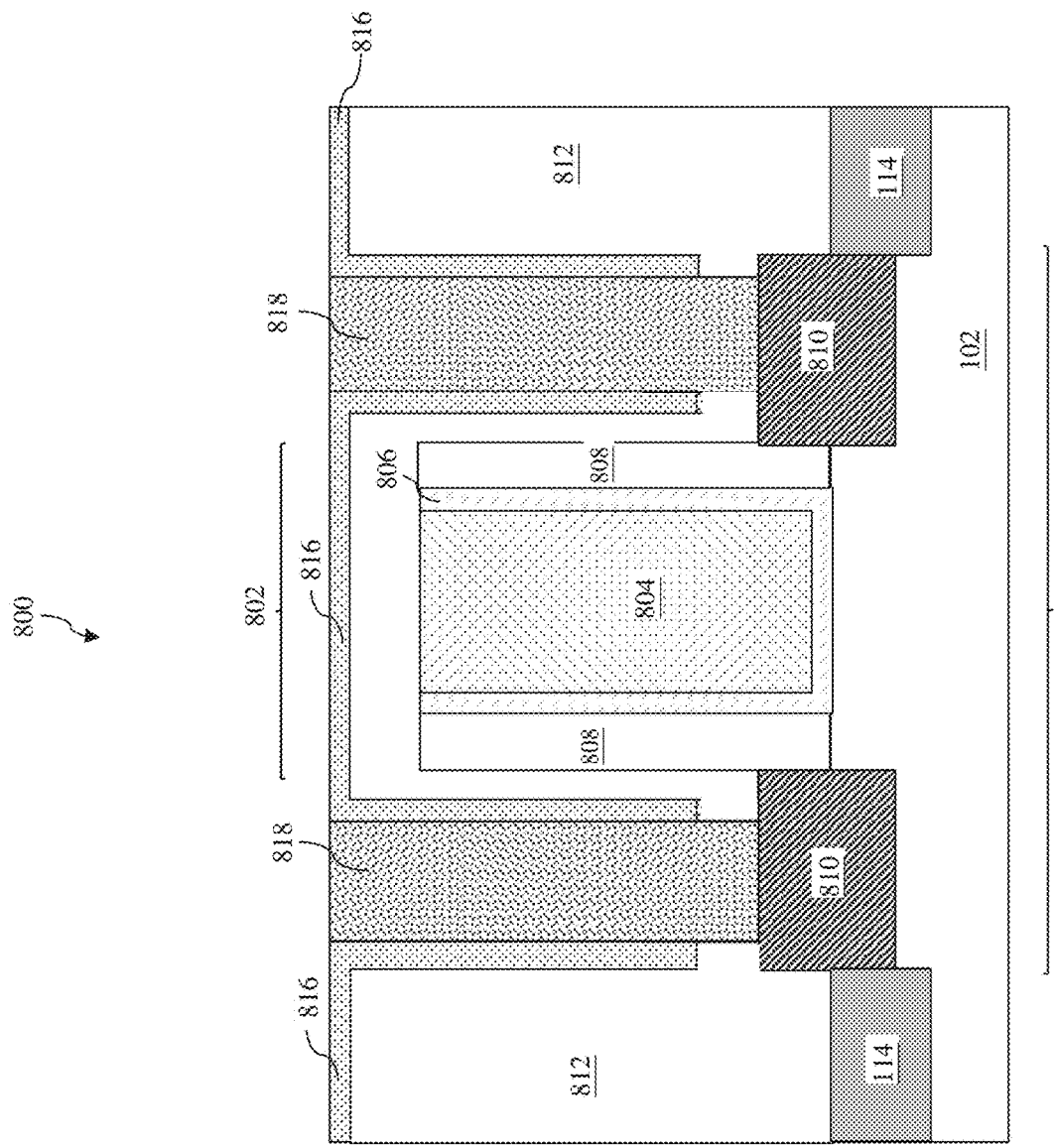

Referring now to FIG. 11, a bottom-up deposition is applied to fill the contact hole 814 with one or more metal, thereby forming a contact 818 in the contact hole 814. In various embodiments, the contact 818 may include Ru, Jr, Ni, Os, Rh, Al, Mo, W, Co or a combination thereof. The bottom-up deposition may be controlled to fill the metal up to the level at the top surface of the first dielectric layer 812, without employing CMP. Alternatively, the bottom-up deposition may be controlled to fill the metal up above the top surface of the first dielectric layer 812, and a CMP process is applied to remove the excessive metal and planarize the top surface. In various embodiments, portions of the barrier layer 816 on the top surface of the first dielectric layer 812 are removed by etch or CMP, or alternatively remain.

Figure 12:
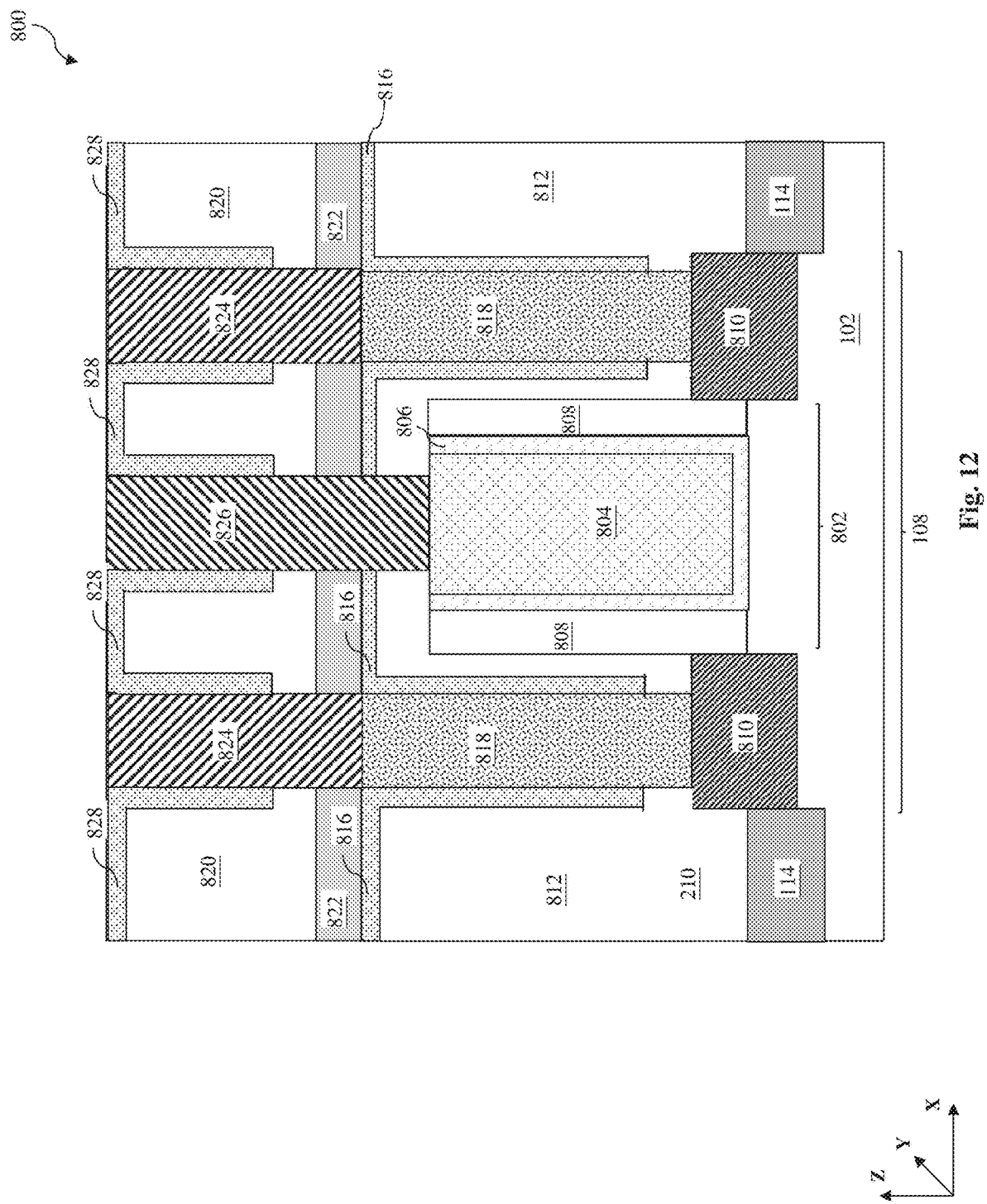
Figure 13:
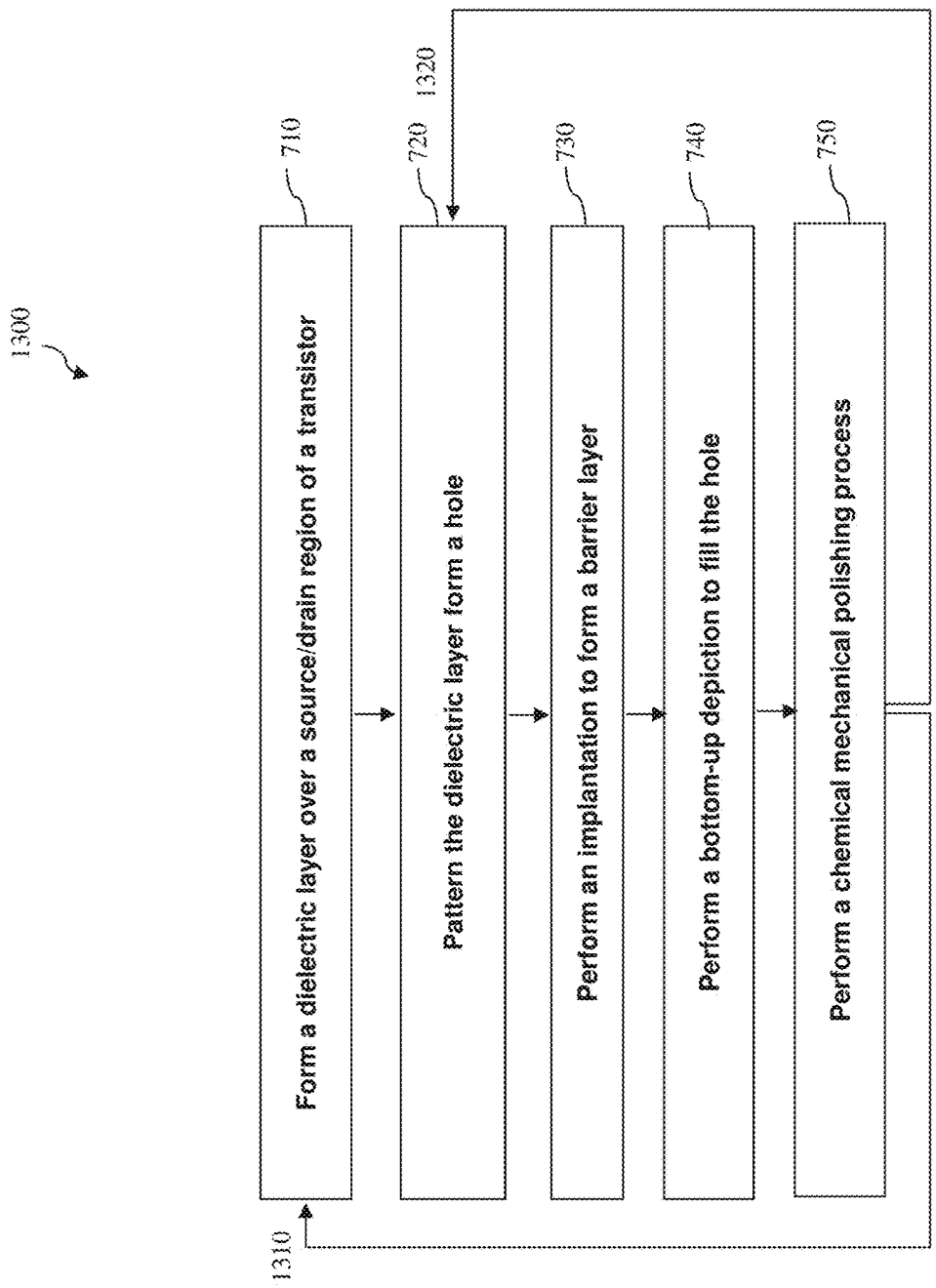
FIG. 13 is a flowchart illustrating a method of fabricating an IC structure according to embodiments of the present disclosure.

Referring now to FIG. 12, another dielectric layer is formed on the IC structure 800. In the present embodiment, the dielectric layer includes a second dielectric layer 820 formed by deposition and CMP and may additionally include an etch stop layer 822 formed by deposition. Similar cyclic procedure (including the operations 720-740 or additionally operation 750) is repeated applied to the second dielectric layer 820 to form a metal plug 824 to the contact 818 and a metal plug 826 to the gate electrode 804, and barrier layer 828. The metal plugs 824 and 826 are formed separately or collectively. For example, the metal plug 824, the metal plug 826 and the barrier layer 828 are formed collectively by a cyclic procedure that includes the operations 720-740 (or additionally the operation 750). In another example, the metal plug 824 is formed by the cyclic procedure including the operations 720-740 and thereafter, the metal plug 826 is formed by the same cyclic procedure, or vice versa.

In various embodiments, the metal plugs 824/826 and the contact 818 may include different metals with different schemes. For examples, the contact 818 includes at least one of Ru, Ir, Ni, Os, Rh, Al, Mo, W, and Co without conventional barrier while the via plugs 824/826 include at least one of Co, Cu, Ru, Ni, Al, Pt, Mo, W, Al, Jr, and Os, and additionally with a conventional barrier (such as TiN, etc.). In some embodiments, the barrier layers 816 and 828 have different doping species, different barrier heights, or a combination thereof, such as those illustrated in FIGS. 14-20 in fragmentary cross-sectional side views.

Figure 14:
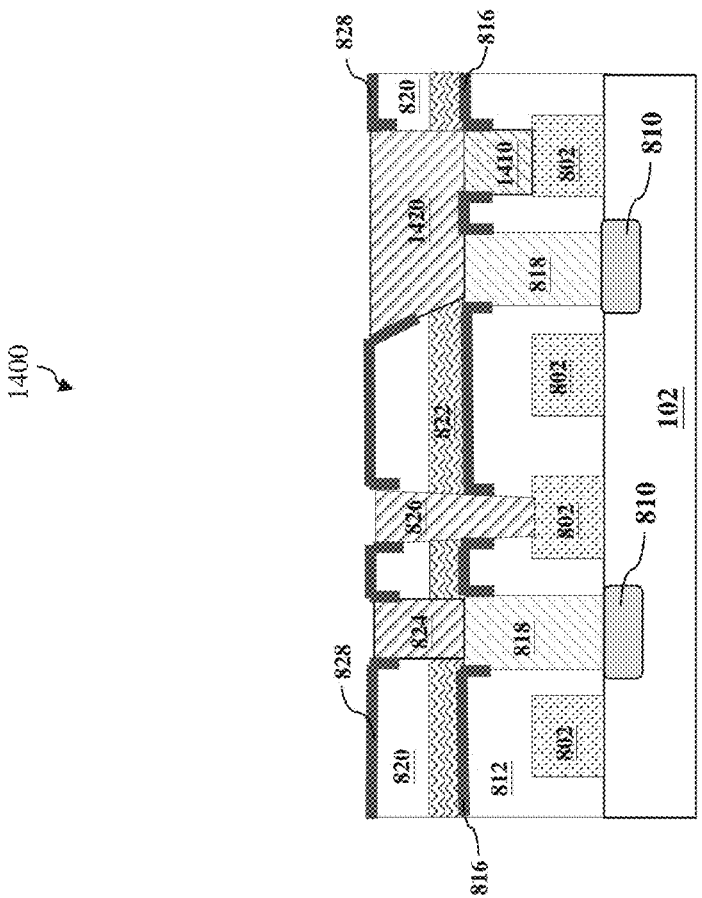

In FIG. 14, top portions of the barrier layers 816 and 828 in the IC structure 1400 remains. Particularly, the metal plug 1410 landing on a gate stack structure 802 and the contacts 818 landing on the S/D features 810 are simultaneously formed by a first cyclic procedure, such as the procedure including the operations 710-740, according to some embodiments. A metal plug 1420 landing on both a contact 818 and the metal plug 1410 with a function similar to a butted contact. In the present embodiment, the metal plugs 824 landing on the contacts 818 and the metal plug 1420 landing on the metal plug 1410 are simultaneously formed by a second cyclic procedure, such as the procedure including the operations 710-740, according to some embodiments. As to a metal plug 826 landing on a gate stack structure 802, the lower portion of the metal plug 826 in the first dielectric layer 812 is formed by the first cyclic procedure while the upper portion in the second dielectric layer 820 is formed by the second cyclic procedure.

Figure 15:
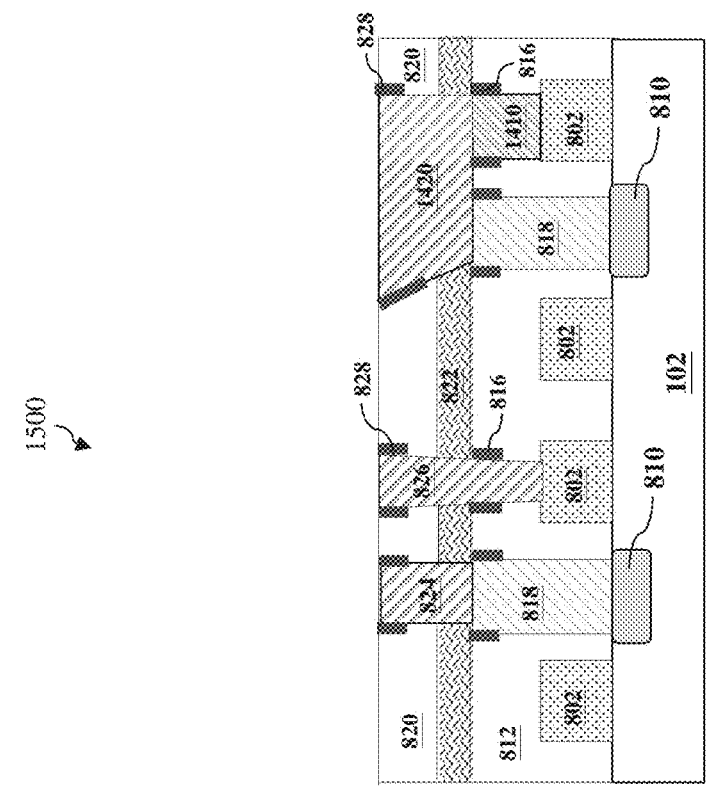
FIGS. 14, 15, 16, 17, 18, 19, 20 and 21 illustrate fragmentary cross-sectional side views of a portion of an IC structure according to different embodiments of the present disclosure

In FIG. 15, top portions of the barrier layers 816 and 828 in the IC structure 1500 are removed, such as by CMP. The method to form the IC structure 1500 is similar to that for the IC structure 1400 but with the top portions of the barrier layers 816 and 828 being removed by CMP. For example, the metal plug 1410 landing on a gate stack structure 802 and the contacts 818 landing on the S/D features 810 are simultaneously formed by a first cyclic procedure including the operations 710-750 according to some embodiments. The metal plugs 824 landing on the contacts 818 and the metal plug 1420 landing on the metal plug 1410 are simultaneously formed by a second cyclic procedure including the operations 710-750 according to some embodiments.

Figure 16:
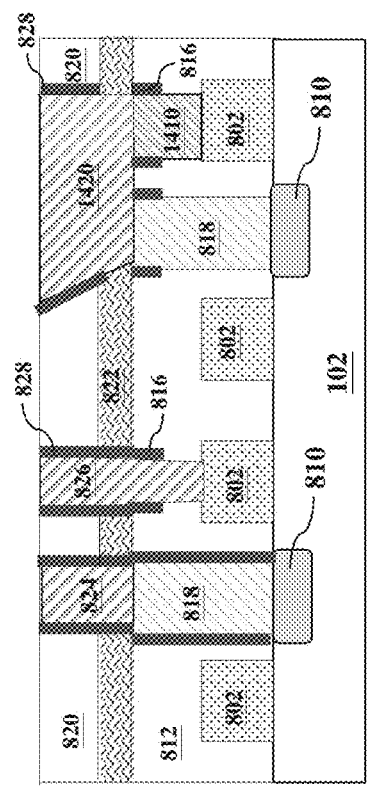

FIG. 16 illustrates a fragmentary cross-sectional side view of an IC structure 1600 similar to the IC structure 1400 but the barrier layers 816 and 828 have different heights. In FIG. 16, the barrier layer 816 vertically spans the full height of the corresponding contacts 818 and the barrier layer 828 vertically spans the full thickness of the second dielectric layer 820.

Figure 17:
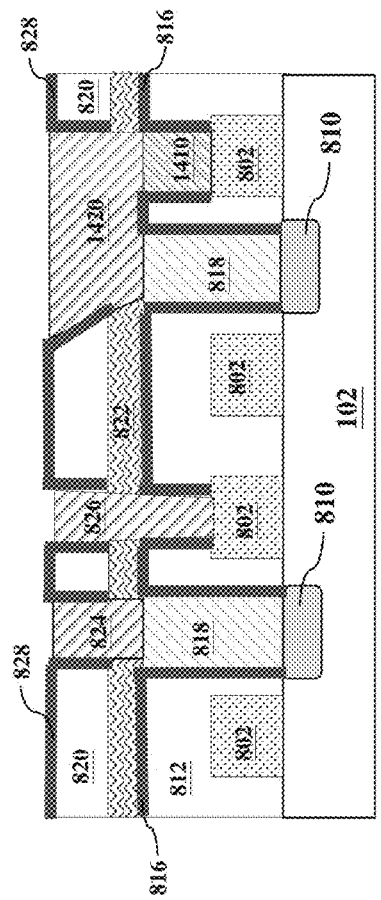

FIG. 17 illustrates a fragmentary cross-sectional side view of an IC structure 1700 similar to the IC structure 1500 but the barrier layers 816 and 828 have different heights. Especially, the barrier layer 816 in left portion and right portion have different heights and may be formed separately, such as by separate cyclic procedures. Similarly, the barrier layer 828 in left portion and right portion have different heights and may be formed separately.

Figure 18:
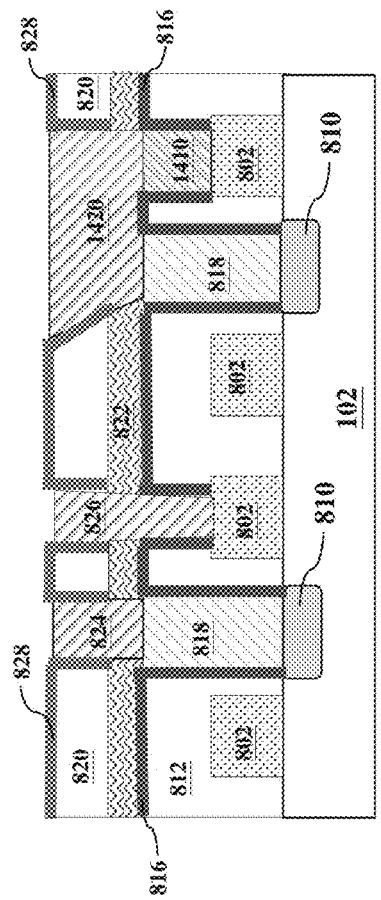

FIG. 18 illustrates a fragmentary cross-sectional side view of an IC structure 1800 similar to the IC structure 1600 but the barrier layers 816 and 828 have different compositions. For example, the barrier layer 816 includes silicon oxide doped with germanium and carbon while the barrier layer 828 includes silicon oxide doped with silicon and boron.

Figure 19:
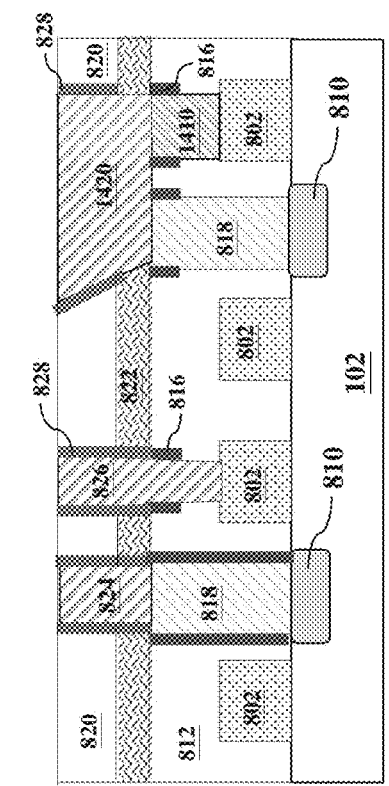

FIG. 19 illustrates a fragmentary cross-sectional side view of an IC structure 1900 similar to the IC structure 1700 but the barrier layers 816 and 828 have different compositions. For example, the barrier layer 816 includes silicon oxide doped with silicon and boron while the barrier layer 828 includes silicon oxide doped with germanium and carbon.

Figure 20:
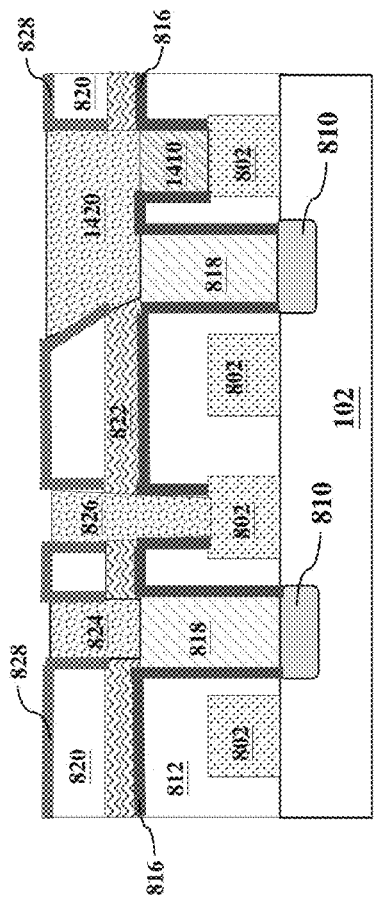

FIG. 20 illustrates a fragmentary cross-sectional side view of an IC structure 2000 similar to the IC structure 1800 but various metal plugs further use different metals to maximize the device performance according to dimensions, resistivity and parasitic capacitance in different ILD layers. For example, the contacts 818 and metal plug 1410 include ruthenium while the metal plugs 824, 826 and 1420 include tungsten. In some embodiments, the metal plugs 824, 826 and 1420 are additionally surrounded by a conventional barrier layer while the contacts 818 and metal plug 1410 directly contact the barrier layer 816.

Figure 21:
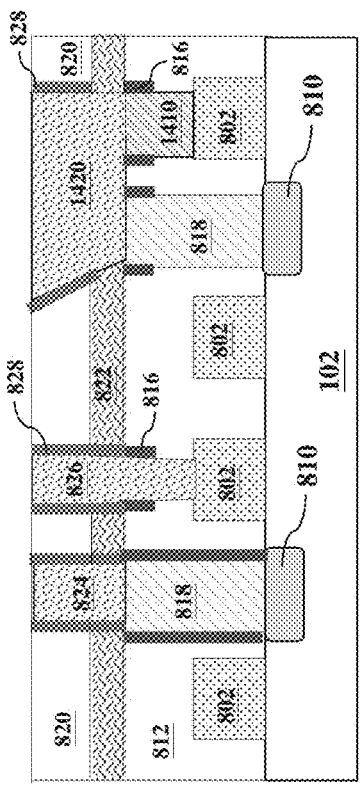

FIG. 21 illustrates a fragmentary cross-sectional side view of an IC structure 2100 similar to the IC structure 1900 but various metal plugs further use different metals to maximize the device performance. For example, the contacts 818 and metal plug 1410 include ruthenium while the metal plugs 824, 826 and 1420 include cobalt.

FIG. 13 is a flowchart of a method 1300 to form contacts 818 and via plugs 824/826 constructed in accordance with some embodiments. The method 1300 includes a cyclic procedure including operations 710-740 (or 710-750) to form contacts 818 and is repeated in 1310 to form the metal plugs 824 and 826. Alternatively, the method 1300 applies the cyclic procedure 710-740 (or 710-750) to form contacts 818; repeats the operations 710-740 in 1310 to form the metal plugs 824 (or 826); and repeats the operations 720-740 in 1320 to form the metal plugs 826 (or 824). It is understood that that the operation 750 may be skipped according to some embodiments. In some embodiments, the cyclic procedure is employed to form contact, gate electrode, via plug, metal line or a combination thereof. In some embodiments, the method 1300 employs a cyclic procedure including operations 710-740 and 760 (or 710-740, 760 and 750) to form various metal plugs capped with self-aligned dielectric features. For example, the cyclic procedure including operations 710-740, 760 and 750 is used to form a gate electrode capped with a self-aligned dielectric feature. When a metal plug (formed by the disclosed method) is landing on the gate electrode, it is self-aligned with the gate electrode since the etching process selectively etches the self-aligned feature but does not etch the dielectric layer surrounding the metal plug due to the etch selectivity.

It is understood that additional processes may be performed before, during, or after the operations 710-750, 1310 and 1320 of the method 1300. For example, in some embodiments, the method 1300 may include an operation to form a multiple layer interconnection (MLI) structure that includes metal lines in various metal layers and via plugs between adjacent metal layers. In various embodiments, the conductive features (such as metal lines and via plugs) of the MLI structure includes aluminum, copper, aluminum/silicon/copper alloy, titanium, titanium nitride, tungsten, polysilicon, metal silicide, or combinations. The MLI structure may use aluminum interconnection formed by deposition and etching, or copper interconnection formed by damascene process. In the aluminum interconnection, the conductive features include aluminum, such as aluminum/silicon/copper alloy. The formation of the aluminum conductive features includes deposition, and patterning process to the deposited aluminum layer. In the copper interconnection, the conductive features include copper and may further include a barrier layer. The copper interconnect structure is formed by a damascene process. A damascene process includes depositing an ILD layer; patterning the ILD layer to form trenches; depositing various conductive materials (such as a barrier layer and copper); and performing a CMP process. A damascene process may be a single damascene process or a dual damascene process. The deposition of the copper may include PVD to form a seed layer and plating to form bulk copper on the copper seed layer. For reasons of simplicity, other additional steps are not discussed herein in detail.

In summary, the present disclosure performs an ion implantation process to form a barrier layer in an opening of a dielectric layer and a bottom-up deposition to fill the opening, forming a metal plug, such as a contact, a via plug, a gate electrode or a metal line. The barrier layer formed by the ion implantation has an intensified structure to prevent the inter-diffusion and a modified surface characteristic to boost bottom-up deposition. However, the barrier layer is different from the existing barrier layer in terms of composition and formation. The barrier layer is formed by the ion implantation not by deposition, and it is formed on the sidewalls of the opening but not on the bottom surface of the opening. Furthermore, the barrier layer and the dielectric layer are similar but different in composition. The dielectric layer includes a dielectric material (such as silicon oxide) and the barrier layer includes the dielectric material doped with one or more doping species.

Based on the above discussions, it can be seen that the present disclosure offers advantages over conventional metal plugs. It is understood, however, that other embodiments may offer additional advantages, and not all advantages are necessarily disclosed herein, and that no particular advantage is required for all embodiments. One advantage is that the barrier is formed by ion implantation without reduction in the size of the metal plug, reducing the contact resistance. It also reduces fabrication cost by eliminating the deposition and etching. The ion implantation process also modifies the characteristic of the sidewall surface to boost the bottom-up deposition, which has better gap filling effect and may further eliminate CMP process to form metal plug. It is understood that the present disclosure is not limited to FinFET devices and may apply to planar devices as well. The modified sidewall surface also improves the adhesion of the metal plug to the barrier layer formed by the ion implantation due to the bonding of the metal material to silicon or germanium. Partial modification to the sidewall surface (e.g., upper portions of the sidewall surface of the dielectric layer) also eliminates the damages or impacts to the devices and improves the device performance.

One aspect of the present disclosure pertains to a method of fabricating an integrated circuit (IC) structure. The method includes patterning a dielectric layer on a semiconductor substrate to form a trench, exposing a conductive feature within the trench; performing an ion implantation process to sidewalls of the dielectric layer within the trench, thereby forming a barrier layer on the sidewalls, the barrier layer having a densified structure to effectively prevent inter-diffusion and a modified surface characteristic to boost a bottom-up deposition; and performing a bottom-up deposition to fill the trench with a metal material, thereby forming a metal plug landing on the conductive feature.

Another one aspect of the present disclosure pertains to a method of fabricating an integrated circuit (IC) structure. The method includes forming a trench in a dielectric layer on a semiconductor substrate, a conductive feature being exposed within the trench; performing an ion implantation process to sidewalls of the dielectric layer within the trench, thereby forming a barrier layer on the sidewalls with a densified structure to effectively prevent inter-diffusion; and performing a bottom-up deposition to fill the trench with a metal material, wherein the barrier layer has a modified surface characteristic to boost the bottom-up deposition.

Yet another aspect of the present disclosure pertains to an integrated circuit (IC) structure that includes a semiconductor substrate; a dielectric layer on the semiconductor substrate, the dielectric layer including a trench having a modified sidewall surface of the dielectric layer implanted by a doping species with a densified structure and; a conductive feature on the semiconductor substrate within the trench; and a metal plug in the trench, the metal plug contacting the modified sidewall surface and conductive feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. An integrated circuit (IC) structure, comprising:
a semiconductor substrate;
a source/drain feature over the semiconductor substrate;
a gate stack over the semiconductor substrate and adjacent the source/drain feature;
a dielectric layer over the semiconductor substrate and surrounding the source/drain feature and the gate stack;
a first metal plug over the source/drain feature and buried in the dielectric layer, wherein the dielectric layer includes a first hydrophobic sidewall having a vertical portion and a horizontal portion, the vertical portion interfacing the first metal plug and the horizontal portion extends along a top surface of the dielectric layer; and
a second metal plug penetrating through the dielectric layer to land on the gate stack, wherein the horizontal portion of the first hydrophobic sidewall directly contacts the second metal plug.

2. The IC structure of claim 1,
wherein the dielectric layer is a silicon oxide layer,
wherein the first hydrophobic sidewall is a silicon-rich silicon oxide layer surrounding the silicon oxide layer, wherein the silicon-rich silicon oxide layer has at least 10% greater silicon doping concentration than the silicon oxide layer.

3. The IC structure of claim 1,
wherein the dielectric layer includes a silicon oxide layer,
wherein the first hydrophobic sidewall is a silicon carbide oxide layer surrounding the silicon oxide layer.

4. The IC structure of claim 1, wherein the horizontal portion extends a greater length than the vertical portion.

5. The IC structure of claim 1, further comprising:
gate spacers along sidewalls of the gate stack, the gate spacers is surrounded by the dielectric layer, and the dielectric layer separates the gate spacers from the first hydrophobic sidewall.

6. The IC structure of claim 1, wherein the dielectric layer is a first dielectric layer, further comprising:
a second dielectric layer over the first dielectric layer; and
a third metal plug penetrating through the second dielectric layer to land on the first metal plug, wherein the second dielectric layer includes a second hydrophobic sidewall having a vertical portion and a horizontal portion, the vertical portion interfacing the third metal plug and the horizontal portion extends along a top surface of the second dielectric layer.

7. The IC structure of claim 1, wherein the dielectric layer is a first dielectric layer, further comprising:
a second dielectric layer over the first dielectric layer, wherein the second metal plug further penetrates through the second dielectric layer,
wherein the second dielectric layer includes a second hydrophobic sidewall having a vertical portion and a horizontal portion, the vertical portion interfacing the second metal plug and the horizontal portion extends along a top surface of the second dielectric layer.

8. An integrated circuit (IC) structure, comprising:
a semiconductor substrate;
a source/drain (S/D) feature over the semiconductor substrate;
a gate stack over the semiconductor substrate and adjacent the S/D feature;
gate spacers along sidewalls of the gate stack;
an interlayer dielectric (ILD) layer over the semiconductor substrate and embedding the S/D feature, the gate stack, and the gate spacers;
an S/D contact over the S/D feature and buried in the ILD layer; and
a hydrophobic barrier layer disposed between the S/D contact and the ILD layer, the hydrophobic barrier layer extends vertically along sidewalls of the S/D contact and the ILD layer,
wherein the hydrophobic barrier layer includes silicon oxide doped with silicon or carbon.

9. The IC structure of claim 8, wherein the ILD layer includes silicon oxide, the hydrophobic barrier layer includes silicon oxide doped with silicon to create a silicon-rich silicon oxide layer.

10. The IC structure of claim 8, wherein the ILD layer includes silicon oxide, the hydrophobic barrier layer includes silicon oxide doped with carbon to create a silicon carbide oxide layer.

11. The IC structure of claim 8, wherein the ILD layer includes silicon oxide, the hydrophobic barrier layer includes silicon oxide doped with silicon and carbon to create a silicon-rich silicon carbide oxide layer.

12. The IC structure of claim 8, wherein a top surface of the ILD layer is above a top surface of the gate spacers.

13. The IC structure of claim 12, wherein the hydrophobic barrier layer is further disposed along the top surface of the ILD layer.

14. The IC structure of claim 9, wherein the hydrophobic barrier layer is separated from the S/D feature by a portion of the ILD layer.

15. The IC structure of claim 9, further comprising:
a second ILD layer over the ILD layer;
an S/D via plug over the S/D contact and buried in the second ILD layer; and
a second hydrophobic barrier layer disposed between the S/D via plug and the second ILD layer, the second hydrophobic barrier layer extends vertically along sidewalls of the S/D via plug and the second ILD layer,
wherein the second hydrophobic barrier layer includes silicon oxide doped with silicon or carbon.

16. The IC structure of claim 15, wherein the hydrophobic barrier layer is a first hydrophobic barrier layer, and the first and second hydrophobic barrier layers have different heights.

17. The IC structure of claim 16, wherein the first hydrophobic barrier layer is doped with carbon and germanium, and the second hydrophobic barrier layer is doped with silicon and boron.

18. An integrated circuit (IC) structure, comprising:
a semiconductor substrate;
a source/drain (S/D) feature over the semiconductor substrate;
a gate stack over the semiconductor substrate and adjacent the S/D feature;
gate spacers along sidewalls of the gate stack;
an interlayer dielectric (ILD) layer over the semiconductor substrate and embedding the S/D feature, the gate stack, and the gate spacers;
an S/D contact over the S/D feature and buried in the ILD layer;
a hydrophobic barrier layer disposed between the S/D contact and the ILD layer, the hydrophobic barrier layer extends vertically along sidewalls of the S/D contact and the ILD layer and horizontally along a top surface of the ILD layer;
an etch stop layer disposed on the hydrophobic barrier layer; and
a second ILD layer over the etch stop layer.

19. The IC structure of claim 18, further comprising:
an S/D via plug over the S/D contact and buried in the second ILD layer and the etch stop layer; and
a second hydrophobic barrier layer disposed between the S/D via plug and the second ILD layer, the second hydrophobic barrier layer extends vertically along sidewalls of the S/D via plug and the second ILD layer and horizontally along a top surface of the second ILD layer.

20. The IC structure of claim 18, further comprising:
a gate via plug over the gate stack and buried in the second ILD layer, the etch stop layer, and the ILD layer; and
a second hydrophobic barrier layer disposed between the gate via plug and the second ILD layer, the second hydrophobic barrier layer extends vertically along sidewalls of the gate via plug and the second ILD layer and horizontally along a top surface of the second ILD layer.

* * * * *